US012211584B2

(12) United States Patent
Okamoto et al.

(10) Patent No.: US 12,211,584 B2
(45) Date of Patent: Jan. 28, 2025

(54) SEMICONDUCTOR DEVICE

(71) Applicant: Semiconductor Energy Laboratory Co., Ltd., Atsugi (JP)

(72) Inventors: Yuki Okamoto, Ebina (JP); Tatsuya Onuki, Atsugi (JP); Munehiro Kozuma, Atsugi (JP); Takanori Matsuzaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 79 days.

(21) Appl. No.: 17/802,281

(22) PCT Filed: Mar. 4, 2021

(86) PCT No.: PCT/IB2021/051788
§ 371 (c)(1),
(2) Date: Aug. 25, 2022

(87) PCT Pub. No.: WO2021/186279
PCT Pub. Date: Sep. 23, 2021

(65) Prior Publication Data
US 2023/0099168 A1    Mar. 30, 2023

(30) Foreign Application Priority Data
Mar. 18, 2020   (JP) .................................. 2020-047259

(51) Int. Cl.
*G11C 7/10*   (2006.01)
*G11C 7/12*   (2006.01)
(Continued)

(52) U.S. Cl.
CPC .............. *G11C 7/1096* (2013.01); *G11C 7/12* (2013.01); *G11C 8/08* (2013.01); *H01L 29/7869* (2013.01); *H10B 12/31* (2023.02); *H10B 12/50* (2023.02)

(58) Field of Classification Search
None
See application file for complete search history.

(56) References Cited

U.S. PATENT DOCUMENTS 6,493,263 B1    12/2002   Shibata et al.
9,007,812 B2     4/2015   Koyama et al.
(Continued)

FOREIGN PATENT DOCUMENTS

CN    102436846 A    5/2012
JP    02-059956 A    2/1990
(Continued)

OTHER PUBLICATIONS

International Search Report (Application No. PCT/IB2021/051788) Dated Jun. 15, 2021.
(Continued)

*Primary Examiner* — Tan T. Nguyen
(74) *Attorney, Agent, or Firm* — Eric J. Robinson; Robinson Intellectual Property Law Office, P.C.

(57) ABSTRACT

A semiconductor device with a novel structure is provided. The semiconductor device includes a plurality of arithmetic blocks each including an arithmetic circuit portion and a memory circuit portion. The arithmetic circuit portion and the memory circuit portion are electrically connected to each other. The arithmetic circuit portion and the memory circuit portion have an overlap region. The arithmetic circuit portion includes, for example, a Si transistor, and the memory circuit portion includes, for example, an OS transistor. The arithmetic circuit portion has a function of performing product-sum operation. The memory circuit portion has a function of retaining weight data. A first driver circuit has a function of writing the weight data to the memory circuit
(Continued)

portion. The weight data is written to all the memory circuit portions included in the same column with the use of the first driver circuit.

21 Claims, 28 Drawing Sheets

(51) Int. Cl.
  *G11C 8/08* (2006.01)
  *H01L 29/786* (2006.01)
  *H10B 12/00* (2023.01)

(56) References Cited

U.S. PATENT DOCUMENTS

| | | | |
|---|---|---|---|
| 9,299,393 | B2 | 3/2016 | Koyama et al. |
| 9,818,473 | B2 | 11/2017 | Tsutsui |
| 10,236,033 | B2 | 3/2019 | Koyama et al. |
| 10,665,270 | B2 | 5/2020 | Koyama et al. |
| 11,101,302 | B2 | 8/2021 | Ikeda et al. |
| 2005/0275647 | A1 | 12/2005 | Numao |
| 2006/0238552 | A1* | 10/2006 | Chuang .................. G09G 5/006 345/690 |
| 2012/0063209 | A1 | 3/2012 | Koyama et al. |
| 2012/0138927 | A1* | 6/2012 | Kang .................. H01L 25/0657 257/E23.002 |
| 2014/0241054 | A1* | 8/2014 | Koyama ............... G11C 11/403 365/184 |
| 2015/0325285 | A1 | 11/2015 | Tsutsui |
| 2017/0154909 | A1 | 6/2017 | Ishizu |
| 2017/0270405 | A1 | 9/2017 | Kurokawa |
| 2018/0181862 | A1 | 6/2018 | Ikeda |
| 2019/0019458 | A1 | 1/2019 | Teraguchi |
| 2019/0122074 | A1 | 4/2019 | Zhang et al. |
| 2020/0006567 | A1 | 1/2020 | Endo et al. |
| 2020/0342915 | A1 | 10/2020 | Koyama et al. |
| 2022/0375529 | A1* | 11/2022 | Yamazaki ........... H01L 21/8234 |

FOREIGN PATENT DOCUMENTS

| | | |
|---|---|---|
| JP | 2007-241475 A | 9/2007 |
| JP | 2012-256822 A | 12/2012 |
| JP | 2015-188071 A | 10/2015 |
| JP | 2019-033233 A | 2/2019 |
| JP | 2019-036280 A | 3/2019 |
| JP | 2019-047006 A | 3/2019 |
| KR | 2014-0014330 A | 2/2014 |
| TW | 201232539 | 8/2012 |
| WO | WO-2019/078924 | 4/2019 |

OTHER PUBLICATIONS

Written Opinion (Application No. PCT/IB2021/051788) Dated Jun. 15, 2021.
Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.
Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.
Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.
Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.
Akyel.K et al., "DRC2: Dynamically Reconfigurable Computing Circuit based on memory architecture", IEEE International Conference on Rebooting Computing, Oct. 17, 2016, pp. 1-8pages.
Agrawal.A et al., "X-SRAM: Enabling In-Memory Boolean Computations in CMOS Static Random Access Memories", IEEE Transactions on Circuits and Systems, Jul. 2, 2018, pp. 1-14.

* cited by examiner

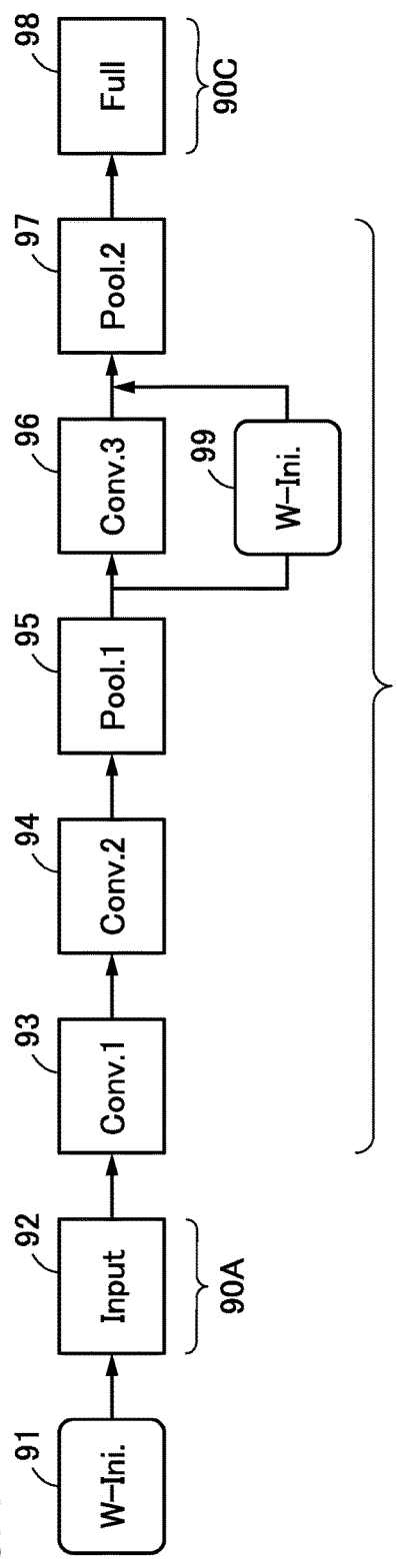
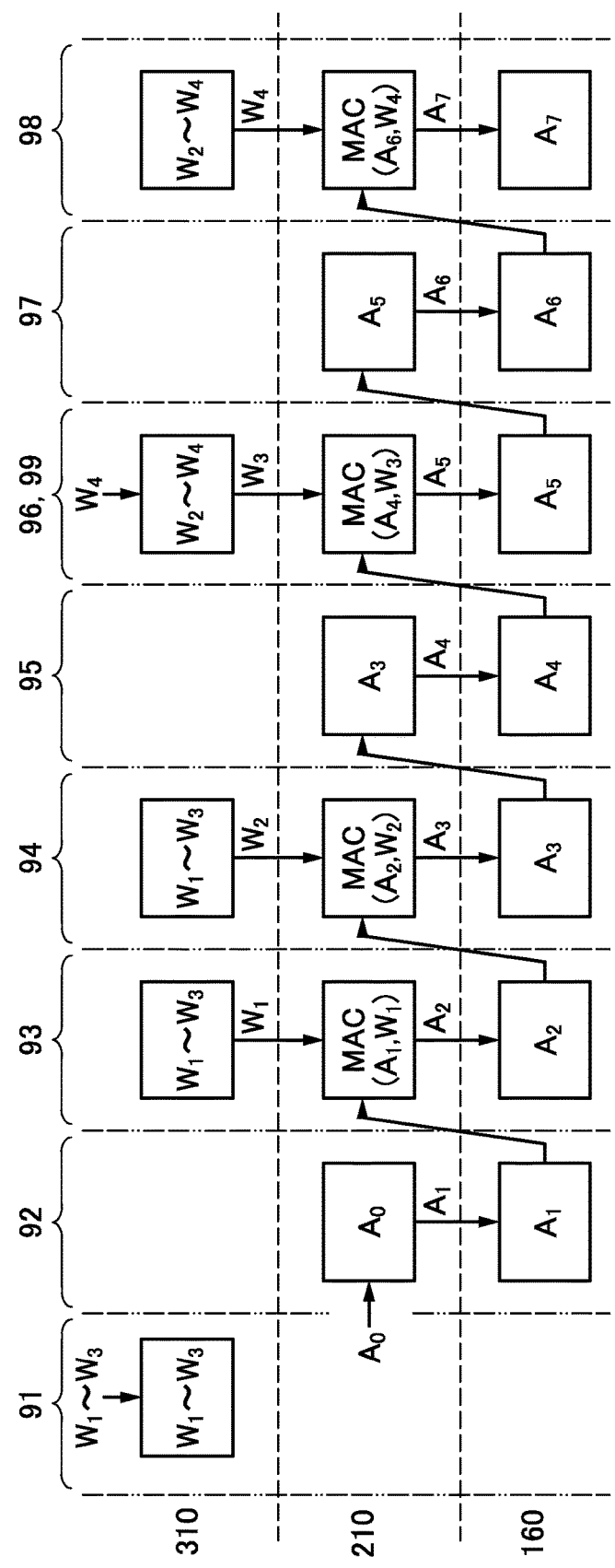
FIG. 9A
FIG. 9B

SEMICONDUCTOR DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Examples of the technical field of one embodiment of the present invention disclosed in this specification and the like include a semiconductor device, a display device, a liquid crystal display device, a light-emitting device, a power storage device, an imaging device, a memory device, a signal processing device, a processor, an electronic device, a system, a driving method thereof, a manufacturing method thereof, and an inspecting method thereof.

BACKGROUND ART

Electronic devices each including a semiconductor device including a CPU (Central Processing Unit) or the like have been widely used. In such electronic devices, techniques for improving the performance of the semiconductor devices have been actively developed to process a large volume of data at high speed. As a technique for achieving high performance, what is called an SoC (System on Chip) technology can be applied in which an accelerator such as a GPU (Graphics Processing Unit) and a CPU are tightly coupled. In the semiconductor device having higher performance by adopting an SoC, heat generation and an increase in power consumption become problems.

AI (Artificial Intelligence) technology requires a large amount of calculation and a large number of parameters and thus the amount of arithmetic operation is increased. An increase in the amount of arithmetic operation causes heat generation and an increase in power consumption. Thus, architectures for reducing the amount of arithmetic operation have been actively proposed. Typical architectures are Binary Neural Network (BNN) and Ternary Neural Network (TNN), which are effective especially in reducing circuit scale and power consumption (see Patent Document 1, for example).

REFERENCE

Patent Document

[Patent Document 1] PCT International Publication No. 2019/078924

SUMMARY OF THE INVENTION

Problems to be Solved by the Invention

An object of one embodiment of the present invention is to provide a semiconductor device that occupies a small area. Another object of one embodiment of the present invention is to provide a semiconductor device with low power consumption. Another object of one embodiment of the present invention is to provide a semiconductor device with improved arithmetic processing speed. Another object is to provide a novel semiconductor device.

Note that the objects of one embodiment of the present invention are not limited to the objects listed above. The objects listed above do not preclude the existence of other objects. The other objects are objects that are not described in this section and will be described below. The objects that are not described in this section can be derived from the description of the specification, the drawings, and the like and can be extracted as appropriate from the description by those skilled in the art. One embodiment of the present invention achieves at least one of the objects listed above and the other objects. One embodiment of the present invention does not necessarily achieve all the objects listed above and the other objects.

Means for Solving the Problems (1) One embodiment of the present invention is a semiconductor device that includes a plurality of arithmetic blocks; the arithmetic blocks each include an arithmetic circuit portion and a memory circuit portion; the arithmetic circuit portion includes a first transistor; the memory circuit portion includes a second transistor; the arithmetic circuit portion is electrically connected to the memory circuit portion; and the arithmetic circuit portion and the memory circuit portion include an overlap region.

In (1), the arithmetic block may include a first driver circuit, a second driver circuit, and a third driver circuit. The first driver circuit, the second driver circuit, and the third driver circuit are electrically connected to the memory circuit portion, and the arithmetic circuit portion, the first driver circuit, the second driver circuit, and the third driver circuit are provided in a first layer. The memory circuit portion is provided in a second layer. The first layer and the second layer include an overlap region.

For example, the first driver circuit may have a function of supplying data to the memory circuit portion. The second driver circuit may have a function of controlling operation of writing data to the memory circuit portion. The third driver circuit may have a function of controlling operation of reading out data from the memory circuit portion. The arithmetic circuit portion has a function of performing product-sum operation, and the memory circuit portion has a function of retaining data. The data retained in the memory circuit portion is, for example, weight data.

The first transistor is preferably a transistor containing silicon in a semiconductor where a channel is formed. The second transistor is preferably a transistor including an oxide semiconductor in a semiconductor where a channel is formed.

(2) Another embodiment of the present invention is a semiconductor device including a plurality of arithmetic blocks arranged in a matrix of M rows and N columns (M and N are each a natural number greater than or equal to 2) and N first driver circuits; each of the N first driver circuits is placed in a corresponding column; each of the plurality of arithmetic blocks includes an arithmetic circuit portion and a memory circuit portion; the arithmetic circuit portion is electrically connected to the memory circuit portion; the arithmetic circuit portion and the memory circuit portion include an overlap region; and the memory circuit portion placed in an e-th column (e is a natural number greater than or equal to 1 and less than or equal to N) is electrically connected to the first driver circuit placed in the e-th column.

In (2), a second driver circuit may be provided extending in the column direction. In (2), each of the plurality of arithmetic blocks includes a third driver circuit.

The memory circuit portion includes a plurality of memory cells, and each of the memory cells preferably includes a transistor including an oxide semiconductor in a semiconductor where a channel is formed.

Effect of the Invention

One embodiment of the present invention can provide a semiconductor device that occupies a small area. Alternatively, a semiconductor device with low power consumption can be provided. Alternatively, a semiconductor device with improved arithmetic processing speed can be provided. Alternatively, a novel semiconductor device can be provided.

Note that the effects of one embodiment of the present invention are not limited to the effects listed above. The effects listed above do not preclude the existence of other effects. The other effects are effects that are not described in this section and will be described below. The effects that are not described in this section can be derived from the description of the specification, the drawings, and the like and can be extracted as appropriate from the description by those skilled in the art. One embodiment of the present invention has at least one of the effects listed above and the other effects. Accordingly, one embodiment of the present invention does not have the effects listed above in some cases.

BRIEF DESCRIPTION OF THE DRAWINGS

FIG. 2.

FIG. 9A is a block diagram showing an arithmetic processing sequence. FIG. 9B is a diagram showing a data flow in the arithmetic processing.

MODE FOR CARRYING OUT THE INVENTION

Figure 1:
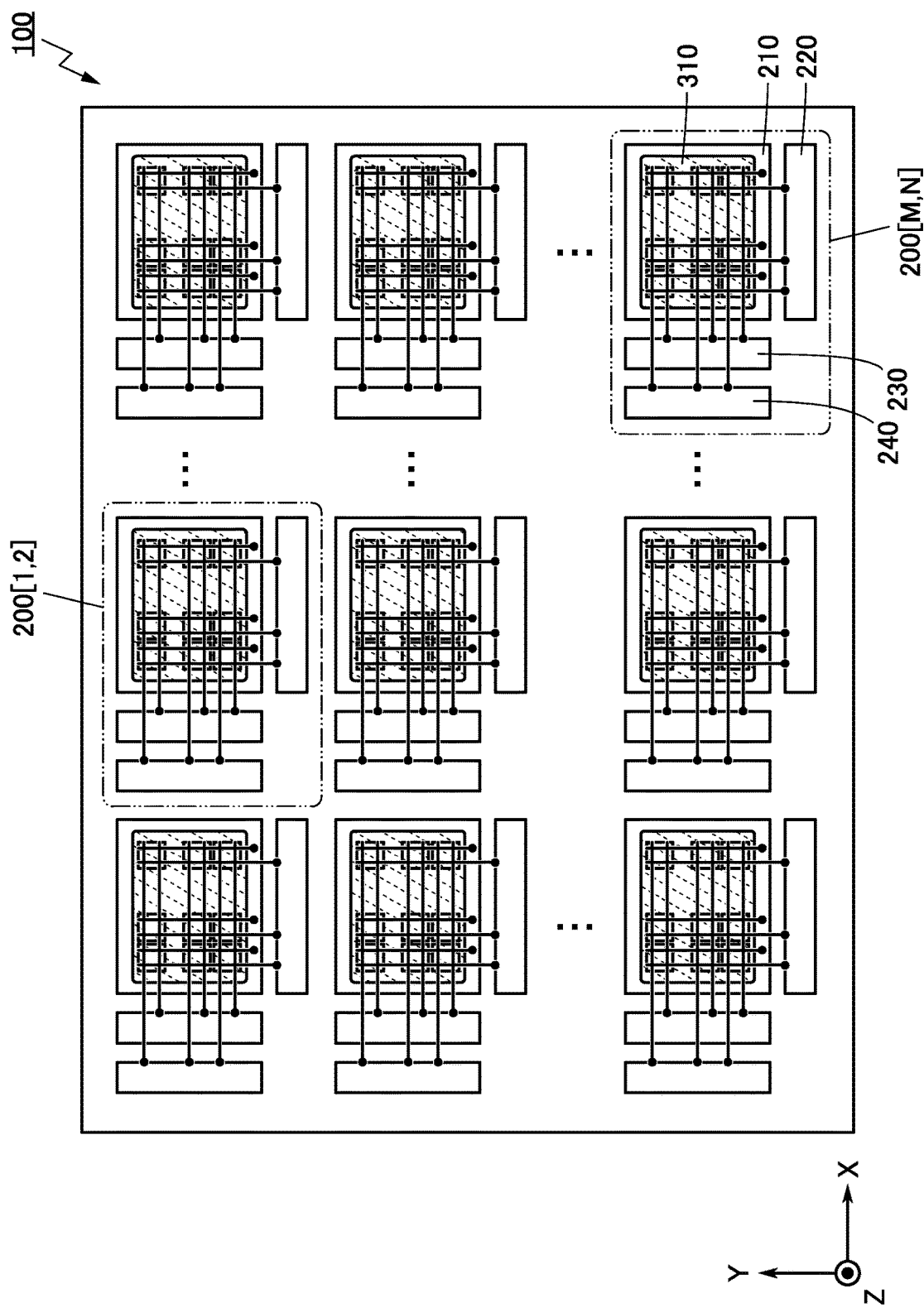
FIG. 1 is a top view illustrating a structure of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves may be semiconductor devices or may each include a semiconductor device.

When this specification and the like state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y Note that a switch is controlled to be in an on state or an off state. That is, a switch has a function of being in a conduction state (on state) or a non-conduction state (off state) to control whether or not current flows.

For example, in the case where X and Y are functionally connected, one or more circuits that enable functional connection between X and Y (e.g., a logic circuit (an inverter, a NAND circuit, a NOR circuit, or the like), a signal converter circuit (a digital-to-analog converter circuit, an analog-to-digital converter circuit, a gamma correction circuit, or the like), a potential level converter circuit (a power supply circuit (e.g., a step-up circuit or a step-down circuit), a level shifter circuit for changing the potential level of a signal, or the like), a voltage source, a current source, a switching circuit, an amplifier circuit (a circuit that can increase the signal amplitude, the amount of current, or the like, an operational amplifier, a differential amplifier circuit, a source follower circuit, a buffer circuit, or the like), a signal generation circuit, a memory circuit, or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; conversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be greater than or equal to 0.05 fF and less than or equal to 10 pF, for example. For another example, the electrostatic capacitance value may be greater than or equal to 1 pF and less than or equal to 10 µF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used to describe the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In addition, in this specification and the like, "on-state current" sometimes refers to current that flows between a source and a drain when a transistor is in an on state. Furthermore, "off-state current" sometimes refers to current that flows between a source and a drain when a transistor is in an off state.

In this specification and the like, a node can be referred to as a terminal, a wiring, an electrode, a conductive layer, a conductor, an impurity region, and the like depending on the circuit structure, the device structure, or the like. Furthermore, a terminal, a wiring, and the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. For another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. For another example, a "first" component in one embodiment in this specification and the like can be omitted in other embodiments or the scope of claims.

The term "over" or "under" does not necessarily mean that a component is placed directly on or directly under and directly in contact with another component. For example, the expression "electrode B over insulating layer A" does not necessarily mean that the electrode B is formed on and in direct contact with the insulating layer A, and does not exclude the case where another component is provided between the insulating layer A and the electrode B.

The positional relation between components changes as appropriate in accordance with the direction in which each component is described. Thus, the positional relation is not limited to that described with a term in this specification and the like and can be described with another term as appropriate depending on the situation. For example, in this specification and the like, terms for describing arrangement, such as "over" and "under", are sometimes used for convenience to describe the positional relation between components with reference to drawings. Accordingly, the expression "an insulator positioned over (on) a top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°.

Similarly, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the term "film", "layer", or the like is not used and can be interchanged with another term depending on the case or situation. For example, the term "conductive layer" or "conductive film" can be changed into the term "conductor" in some cases. For another example, the term "insulating layer" or "insulating film" can be changed into the term "insulator" in some cases.

In this specification and the like, the term "electrode", "wiring", "terminal", or the like does not limit the function of a component. For example, an "electrode" is sometimes used as part of a "wiring", and vice versa. Furthermore, the term "electrode" or "wiring" can also mean the case where a plurality of "electrodes" or "wirings" are formed in an integrated manner, for example. For another example, a "terminal" is sometimes used as part of a "wiring" or an "electrode", and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or situation. For example, the term "wiring" can be changed into the term "signal line" in some cases. For another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or situation. Conversely, the term "signal" or the like can be changed into the term "potential" in some cases.

In this specification and the like, an impurity in a semiconductor refers to, for example, elements other than the main components of a semiconductor layer. For instance, an element with a concentration of lower than 0.1 atomic % is an impurity. When an impurity is contained, for example, the density of defect states in the semiconductor is increased, carrier mobility is decreased, or crystallinity is decreased in some cases. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components; specific examples are hydrogen (included also in water), lithium, sodium, silicon, boron, phosphorus, carbon, and nitrogen. Specifically, when the semiconductor is silicon, examples of impurities that change the characteristics of the semiconductor include oxygen, Group 1 elements except hydrogen, Group 2 elements, Group 13 elements, and Group 15 elements.

In this specification and the like, a switch has a function of controlling whether current flows or not by being in a conduction state (on state) or a non-conduction state (off state). Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, "parallel" indicates a state where the angle formed between two straight lines is greater than or equal to −10° and less than or equal to 10°. Thus, the case where the angle is greater than or equal to −5° and less than or equal to 5° is also included. The term "approximately parallel" or "substantially parallel" indicates a state where the angle formed between two straight lines is greater than or equal to −30° and less than or equal to 30°. The term "perpendicular" indicates a state where the angle formed between two straight lines is greater than or equal to 80° and less than or equal to 100°. Thus, the case where the angle is greater than or equal to 85° and less than or equal to 95° is also included. The term "approximately perpendicular" or "substantially perpendicular" indicates a state where the angle formed between two straight lines is greater than or equal to 60° and less than or equal to 120°.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, in the case where a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of drawings or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that the modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. Moreover, some components may be omitted in a perspective view, a top view, and the like for easy understanding of the drawings.

In addition, in this specification and the like, components are classified on the basis of the functions, and shown as blocks independent of one another in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in the specification, and the description can be changed appropriately depending on the situation.

In the drawings in this specification, the size, the layer thickness, or the region is exaggerated for clarity in some cases. Therefore, they are not limited to the illustrated size, aspect ratio, and the like. Note that the drawings schematically show ideal examples, and embodiments of the present invention are not limited to shapes or values shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification sign such as "A", "b", "_1", "[n]", or "[m,n]" are sometimes added to the reference numerals.

Embodiment 1

A semiconductor device 100 of one embodiment of the present invention will be described with reference to drawings. Note that arrows indicating the X direction, the Y direction, and the Z direction are sometimes illustrated in drawings. The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

<Semiconductor Device 100>

Figure 2A:
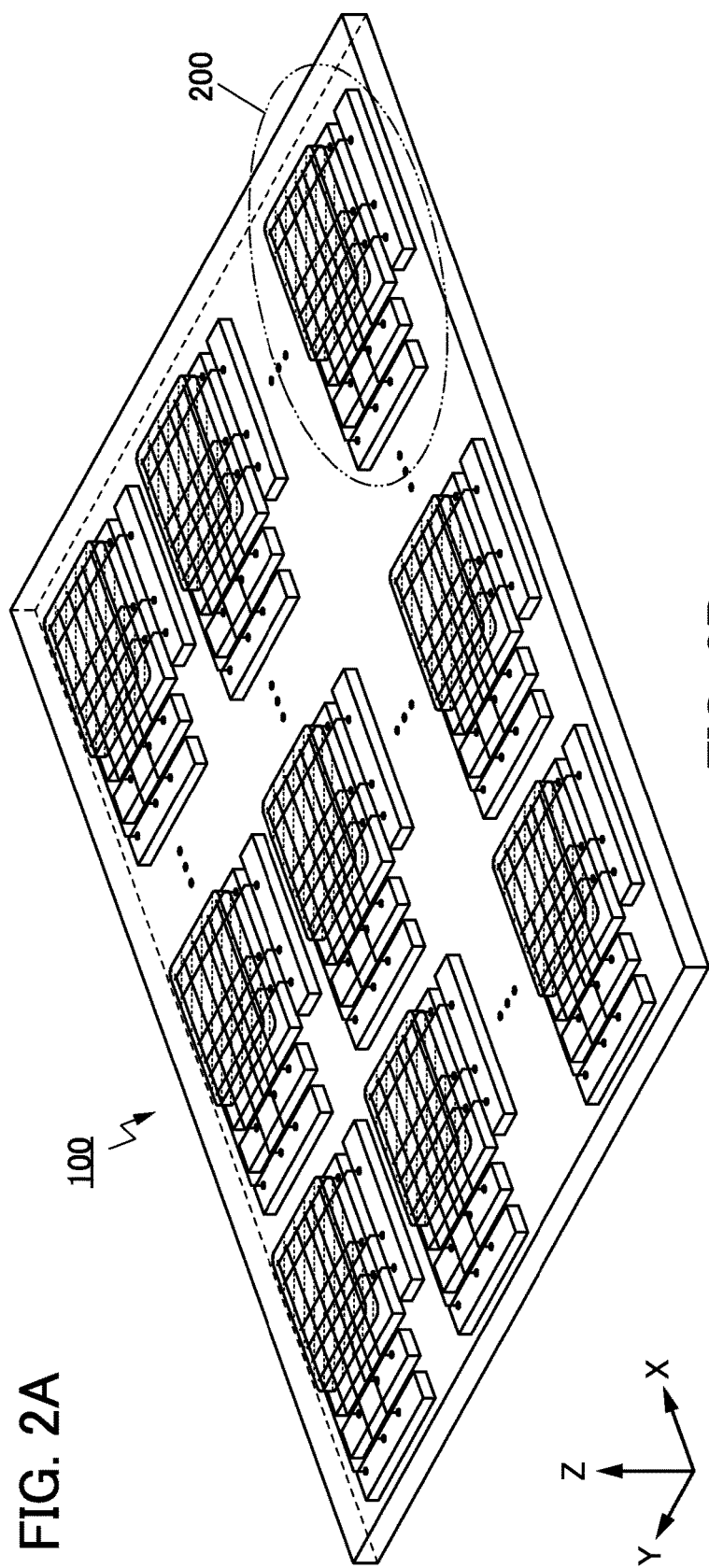
FIG. 2A and FIG. 2B are perspective views each illustrating a structure of a semiconductor device.

FIG. 1 illustrates a top view of the semiconductor device 100. FIG. 2A illustrates a perspective view of the semiconductor device 100.

The semiconductor device 100 has a function as an accelerator. Specifically, the semiconductor device 100 has a function of executing a program (also referred to as kernel or a kernel program) called from a host program. The semiconductor device 100 can perform parallel processing of matrix operation in graphics processing, parallel processing of product-sum operation of a neural network, and parallel processing of floating-point operation in a scientific computation, for example.

<Arithmetic Block>

The semiconductor device 100 includes a plurality of arithmetic blocks 200 arranged in a matrix of M rows and N columns (M and N are each a natural number greater than or equal to 2). In FIG. 1, the arithmetic block 200 in the first row and the second column is referred to as an arithmetic block 200[1,2], and the arithmetic block 200 in the M-th row and the N-th column is referred to as an arithmetic block 200[M,N].

Figure 2B:
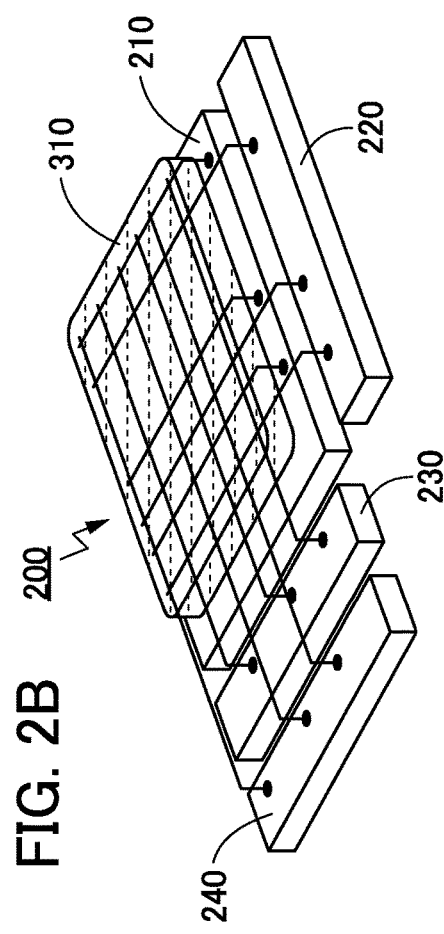

FIG. 2B illustrates a perspective view of the arithmetic block 200. The arithmetic block 200 includes an arithmetic circuit portion 210, a write bit line driver circuit 220, a write word line driver circuit 240, a read word line driver circuit 230, and a memory circuit portion 310.

The arithmetic block 200 is formed using a plurality of transistors. For a semiconductor of the transistor included in the arithmetic block 200, a single crystal semiconductor, a polycrystalline semiconductor, a microcrystalline semiconductor, an amorphous semiconductor, or the like can be used alone or in combination. As a semiconductor material, for example, silicon or germanium can be used. Alternatively, a compound semiconductor such as silicon germanium, silicon carbide, gallium arsenide, an oxide semiconductor, or a nitride semiconductor may be used.

A high electron mobility transistor (HEMT) can be used as the transistor included in the arithmetic block 200, and gallium arsenide, aluminum gallium arsenide, indium gallium arsenide, gallium nitride, indium phosphide, silicon germanium, or the like may be used for the HEMT.

The semiconductor used in the transistor may be a stack of semiconductors. In the case of stacking semiconductors, semiconductors having different crystal states may be stacked or different semiconductor materials may be stacked.

Figure 3:
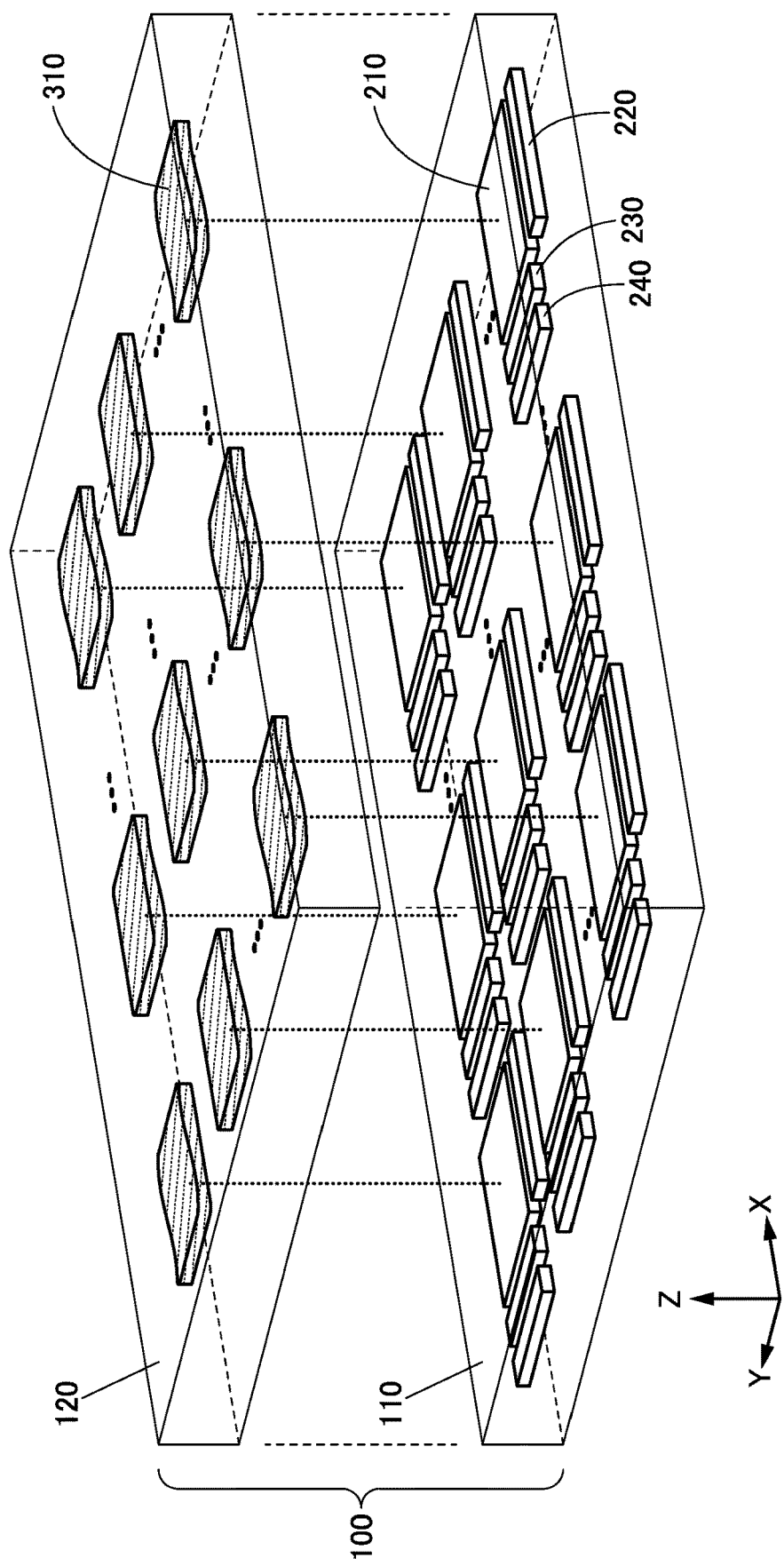
FIG. 3 is a perspective view illustrating a structure of a semiconductor device.

The semiconductor device 100 includes a layer 110 and a layer 120. FIG. 3 illustrates a perspective view of a structure of the semiconductor device 100. The layer 110 and the layer 120 are provided to overlap with each other in the Z direction. Although this embodiment illustrates an example in which the layer 120 is provided over the layer 110, the layer 110 may be provided over the layer 120.

An oxide semiconductor has a band gap of 2 eV or more; thus, a transistor including an oxide semiconductor as a semiconductor where a channel is formed (also referred to as an "OS transistor") has an extremely low off-state current. For example, a transistor containing silicon in a semiconductor where a channel is formed (also referred to as "Si transistor"), specifically, a Si transistor containing crystalline silicon in a semiconductor (also referred to as "crystalline Si transistor") tends to obtain relatively high mobility as compared to the OS transistor. On the other hand, the crystalline Si transistor has difficulty in achieving an extremely low off-state current such as one in the OS transistor.

Thus, it is important that the semiconductor material used for the semiconductor where a channel of the transistor is formed be properly selected depending on the purpose and/or the usage. For example, depending on the purpose and/or the usage, the OS transistor and the Si transistor or another transistor are preferably used in combination.

In the semiconductor device 100 of one embodiment of the present invention, the layer 110 includes a Si transistor, for example, and the layer 120 includes an OS transistor, for example. The arithmetic circuit portion 210, the write bit line driver circuit 220, the write word line driver circuit 240, and the read word line driver circuit 230, which need a higher operation speed than the memory circuit, are provided in the layer 110. In addition, the memory circuit portion 310, which needs to have a low off-state current rather than operation speed, is provided in the layer 120.

The semiconductor material used for the semiconductor of a transistor is changed depending on the purpose and/or the usage, whereby an improvement in operation speed (arithmetic processing speed) and a reduction in power consumption can be achieved.

The layer 110 includes the arithmetic circuit portions 210 in M rows and N columns. Thus, the layer 110 is referred to as an "arithmetic circuit array" in some cases. The layer 120 includes the memory circuit portions 310 in M rows and N columns. Accordingly, the layer 120 is referred to as a "memory array" in some cases. Moreover, the memory circuit portion 310 is referred to as a "memory sub array" in some cases. When the arithmetic circuit array and the memory array are provided to overlap with each other, the size of the semiconductor device 100 can be reduced. That is, when the arithmetic circuit portion 210 and the memory circuit portion 310 have an overlap region, the size of the semiconductor device 100 can be reduced. In addition, the area occupied by the semiconductor device 100 can be reduced.

Figure 4A:
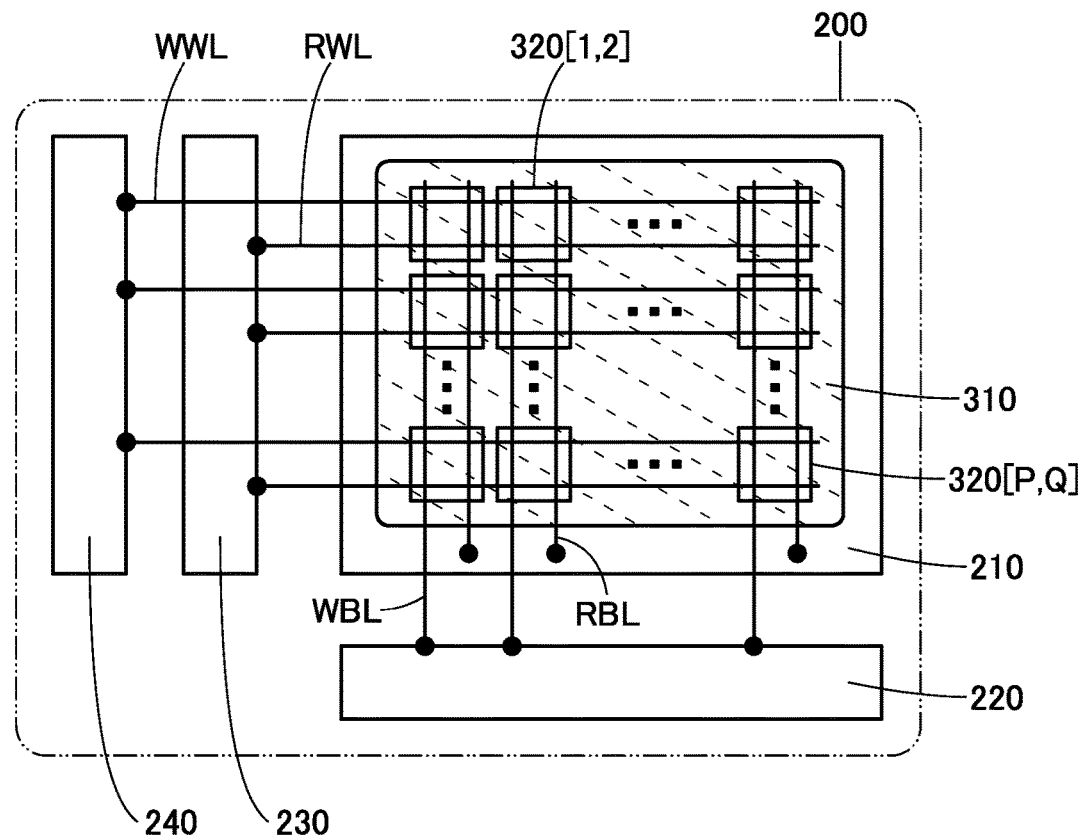
FIG. 4A is a diagram illustrating a structure of an arithmetic block.

FIG. 4A is a diagram illustrating a structure of the arithmetic block 200. The memory circuit portion 310 includes a plurality of memory cells 320 arranged in a matrix of P rows and Q columns (P and Q are each a natural number greater than or equal to 2). Thus, the memory array includes M×N×P×Q memory cells 320. Here, when R=M×P and S=N×Q, it can be said that the memory array includes the plurality of memory cells 320 arranged in a matrix of R rows and S columns.

In FIG. 4A, the memory cell 320 in the first row and the second column is referred to as a memory cell 320[1,2], and the memory cell 320 in the P-th row and the Q-th column is referred to as a memory cell 320[P,Q].

The arithmetic block 200 illustrated in FIG. 4A includes P wirings WWL and P wirings RWL extending in the row direction and Q wirings WBL and Q wirings RBL extending in the column direction.

The i-th (i is a natural number greater than or equal to 1 and less than or equal to P) wiring WWL and the i-th wiring RWL are electrically connected to the Q memory cells 320 placed in the i-th row. The j-th (j is a natural number greater than or equal to 1 and less than or equal to Q) wiring WBL and the j-th wiring RBL are electrically connected to the P memory cells 320 placed in the j-th column.

The memory cells 320 are electrically connected to the arithmetic circuit portion 210 through the wirings RBL. The memory cells 320 are electrically connected to the write bit line driver circuit 220 through the wirings WBL. The memory cells 320 are electrically connected to the read word line driver circuit 230 through the wirings RWL. The memory cells 320 are electrically connected to the write word line driver circuit 240 through the wirings WWL.

Note that not all the arithmetic blocks 200 included in the semiconductor device 100 necessarily include the arithmetic circuit portion 210 and the memory circuit portion 310 overlapping with each other. Some of the plurality of arithmetic blocks 200 included in the semiconductor device 100 may be the arithmetic block 200 in each of which the arithmetic circuit portion 210 and the memory circuit portion 310 do not overlap with each other.

[Memory Cell]

Figure 4B:
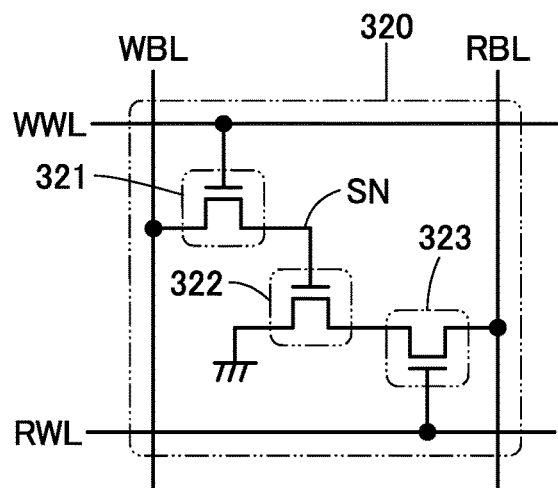
FIG. 4B and FIG. 4C are diagrams illustrating circuit configuration examples of a memory cell.

FIG. 4B illustrates a circuit configuration example that can be used for the memory cell 320. The memory cell 320 illustrated in FIG. 4B as an example includes a transistor 321, a transistor 322, and a transistor 323. A gate of the transistor 321 is electrically connected to the wiring WWL. One of a source and a drain of the transistor 321 is electrically connected to the wiring WBL, and the other thereof is electrically connected to a gate of the transistor 322. One of a source and a drain of the transistor 322 is electrically connected to a wiring for applying a fixed potential such as a ground potential, and the other thereof is electrically connected to one of a source and a drain of the transistor 323. The other of the source and the drain of the transistor 323 is electrically connected to the wiring RBL. A gate of the transistor 323 is electrically connected to the wiring RWL. A node where the other of the source and the drain of the transistor 321 and the gate of the transistor 322 are electrically connected to each other functions as a node SN.

Figure 4C:
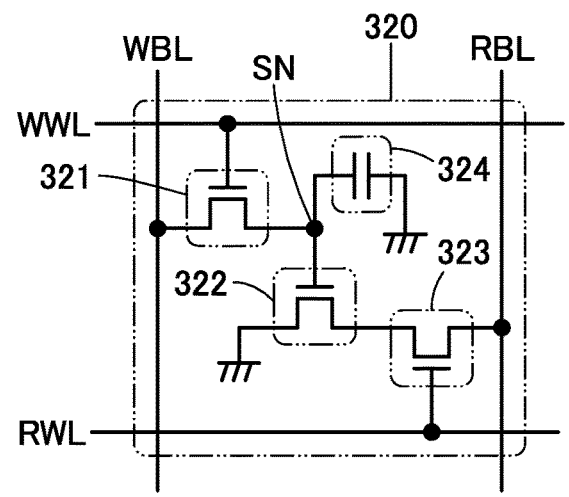

As illustrated in FIG. 4C, the node SN may be provided with a capacitor 324. One electrode included in the capacitor 324 is electrically connected to the gate of the transistor 322 (the node SN), and the other electrode is electrically connected to a wiring for applying a fixed potential such as a ground potential.

An OS transistor is preferably used as the transistor 321. An oxide semiconductor has a band gap of 2 eV or more; thus, an OS transistor has an extremely low off-state current. Accordingly, charge supplied to the node SN can be retained for a long time. In addition, the capacitor 324 can be small or omitted. Moreover, the power consumption of the semiconductor device 100 can be reduced.

When an OS transistor is used as the transistor 321 and transistors other than the OS transistors are used as the transistor 322 and the transistor 323, the transistor 321 may be provided in the layer 120, and the transistor 322 and the transistor 323 may be provided in the layer 110.

OS transistors may be used as the transistor 321, the transistor 322, and the transistor 323. The off-state current of the OS transistor hardly increases even in a high temperature environment. Specifically, the off-state current hardly increases even at an environment temperature higher than or equal to room temperature and lower than or equal to 200° C. Furthermore, the OS transistor has high breakdown voltage between its source and drain. When an OS transistor is used, a semiconductor device can achieve stable operation and high reliability even in a high-temperature environment. A memory including an OS transistor is also referred to as an "OS memory".

When OS transistors are used as the transistor 321, the transistor 322, and the transistor 323, the memory circuit portion 310 can be stacked directly above the arithmetic circuit portion 210.

The circuit configuration examples illustrated in FIG. 4B and FIG. 4C are circuit configurations of a NOSRAM (registered trademark). "NOSRAM" is an abbreviation for "Nonvolatile Oxide Semiconductor RAM". The NOSRAM is a memory element in which its memory cell is a 2-transistor (2T) or 3-transistor (3T) gain cell, and its access transistor is an OS transistor. Thus, the NOSRAM is a kind of OS memory.

The NOSRAM can function as a nonvolatile memory by retaining charge corresponding to data in the memory circuit (the node SN), using characteristics of an extremely low off-state current of the OS transistor. The NOSRAM is capable of reading out retained data without destruction (non-destructive reading), and thus is suitable for parallel processing of product-sum operation of a neural network in which data reading operation is repeated many times, for example.

Data that can be retained in the memory cell 320 is not limited to 1-bit data. The memory cell 320 can retain multi-bit data (multilevel data) or analog data.

A circuit configuration that can be used for the memory cell 320 is not limited to the circuit configurations illustrated in FIG. 4B and FIG. 4C. For example, a circuit corresponding to a DOSRAM illustrated in FIG. 5A may be employed. "DOSRAM" refers to a RAM including a 1T1C memory cell including an OS transistor and is an abbreviation for "Dynamic Oxide Semiconductor RAM". Thus, the DOSRAM is a kind of OS memory.

As the memory cell 320, a flash memory, an MRAM (Magnetoresistive RAM), a PRAM (Phase change RAM), an ReRAM (Resistive RAM), an FeRAM (Ferroelectric RAM), or the like may be used.

Figure 5A:
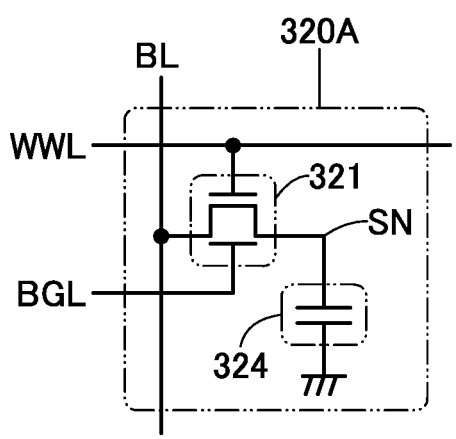
FIG. 5A to FIG. 5C are diagrams illustrating circuit configuration examples of memory cells.

A memory cell 320A illustrated in FIG. 5A includes the transistor 321 and the capacitor 324. The transistor 321 illustrated in FIG. 5A is an OS transistor having a back gate. The memory cell 320A is electrically connected to a wiring BL, the wiring WWL, and a wiring BGL. The wiring BGL is electrically connected to the back gate of the transistor 321. The wiring BL functions as the wiring WBL in some cases and functions as the wiring RBL in some cases.

Figure 5B:
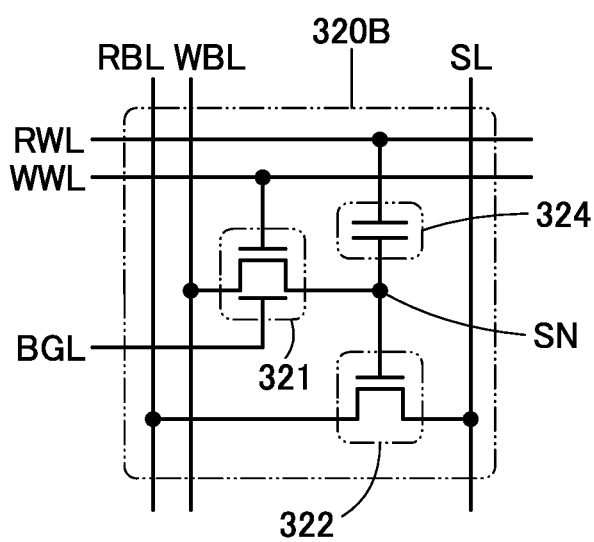

The circuit configuration that can be used for the memory cell 320 may be a circuit corresponding to a 2T NOSRAM illustrated in FIG. 5B. FIG. 5B illustrates a memory cell 320B including the transistor 321, the transistor 322, and the capacitor 324. The transistor 321 and the transistor 322 illustrated in FIG. 5B are OS transistors. The transistor 321 and the transistor 322 may be OS transistors whose semiconductor layers are placed in different layers or may be OS transistors whose semiconductor layers are placed in the same layer.

The memory cell 320B is electrically connected to the wiring WBL, the wiring RBL, the wiring WWL, the wiring RWL, a wiring SL, and the wiring BGL. The wiring BGL is electrically connected to the back gate of the transistor 321. In the memory cell 320B, one electrode of the capacitor 324 is electrically connected to the gate of the transistor 322, and the other electrode thereof is electrically connected to the wiring RWL. One of the source and the drain of the transistor 322 is electrically connected to the wiring RBL, and the other thereof is electrically connected to the wiring SL.

Figure 5C:
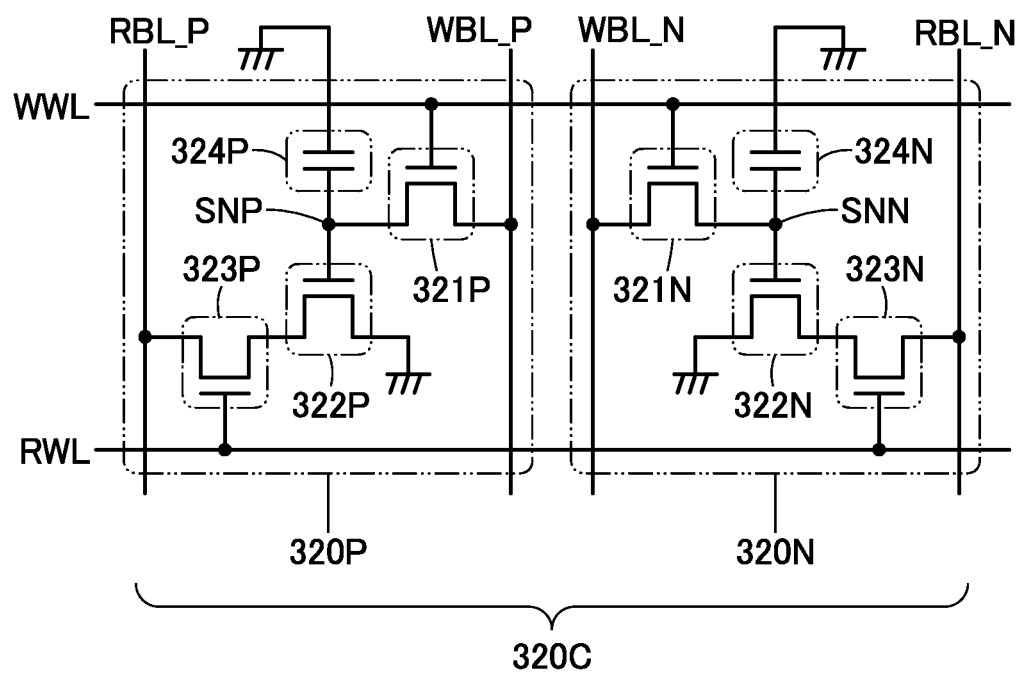

The circuit configuration applicable to the memory cell 320 may be a circuit combined with a 3T NOSRAM illustrated in FIG. 5C. FIG. 5C illustrates a memory cell 320C including a memory cell 320P and a memory cell 320N which can retain different logic data. Transistors included in the memory cell 320C are OS transistors.

The memory cell 320P is electrically connected to a wiring WBL_P, a wiring RBL_P, the wiring WWL, and the wiring RWL. The memory cell 320N is electrically connected to a wiring WBL_N, a wiring RBL_N, the wiring WWL, and the wiring RWL. The memory cell 320P includes a transistor 321P, a transistor 322P, a transistor 323P, and a capacitor 324P, and can retain data (charge) supplied to a node SNP for a long time. The memory cell 320N includes a transistor 321N, a transistor 322N, a transistor 323N, and a capacitor 324N, and can retain data (charge) supplied to a node SNN for a long time.

The semiconductor layers of the transistors included in the memory cell 320C may be placed in different layers or may be placed in the same layer. Furthermore, a plurality of semiconductor layers may be placed in the same layer.

The memory cell 320C can retain data with different kinds of logic in the node SNP and the node SNN. Furthermore, the retained data can be read out through the wiring RBL_P and the wiring RBL_N.

Note that in the structure of FIG. 5C, an exclusive OR circuit (an XOR circuit) may be provided in order to output data corresponding to multiplication of data retained in the memory cell 320P and the memory cell 320N, to the wiring RBL (not illustrated in FIG. 5C). This structure can omit arithmetic operation corresponding to multiplication in the arithmetic circuit portion 210. Thus, the power consumption of the semiconductor device can be reduced.

[Arithmetic Circuit]

Figure 6A:
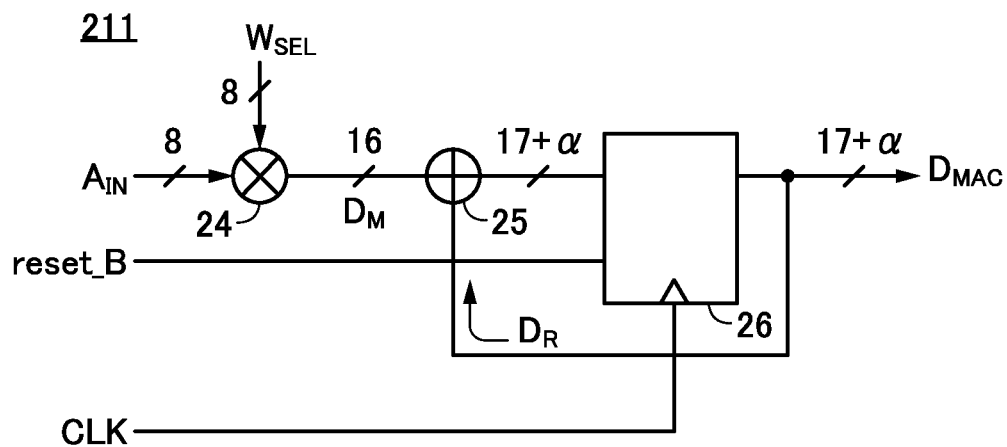
FIG. 6A and FIG. 6B are diagrams illustrating circuit configuration examples of an arithmetic circuit.

An arithmetic circuit for performing various kinds of arithmetic processing such as product-sum operation processing, pooling operation processing, normalization processing, and activation arithmetic processing can be used for the arithmetic circuit portion 210. A plurality of arithmetic circuits can be provided in the arithmetic circuit portion 210. Moreover, a plurality of kinds of arithmetic circuits can be provided in the arithmetic circuit portion 210. FIG. 6A illustrates a circuit configuration example of an arithmetic circuit 211 that can be used for the arithmetic circuit portion 210. FIG. 6A illustrates a circuit configuration example in which product-sum operation of 8-bit weight data W and 8-bit input data A can be performed.

The arithmetic circuit 211 illustrated in FIG. 6A includes a multiplier circuit 24, an adder circuit 25, and a register 26. Weight data $W_{SEL}$, which is selected from a plurality of pieces of the weight data W, and input data $A_{IN}$ are multiplied in the multiplier circuit 24 to be converted into 16-bit data $D_M$ and input to the adder circuit 25. In the adder circuit 25, data $D_R$ retained in the register 26 is added to the data $D_M$ and new data $D_R$ is retained in the register 26. At this time, the number of digits of the new data $D_R$ is 17 bits in some cases. The number of digits of the new data $D_R$ might be increased every time the multiplication and addition are repeated. Thus, "17+α" that represents the number of digits of data is denoted for an output of the adder circuit 25 in FIG. 6A. In addition, "α" represents a carry generated by adding multiplication data. In this manner, output data $D_{MAC}$ corresponding to product-sum operation of the weight data $W_{SEL}$ and the input data $A_{IN}$ can be obtained. Note that the register 26 is controlled by a clock signal CLK and a reset signal reset_B.

Figure 6B:
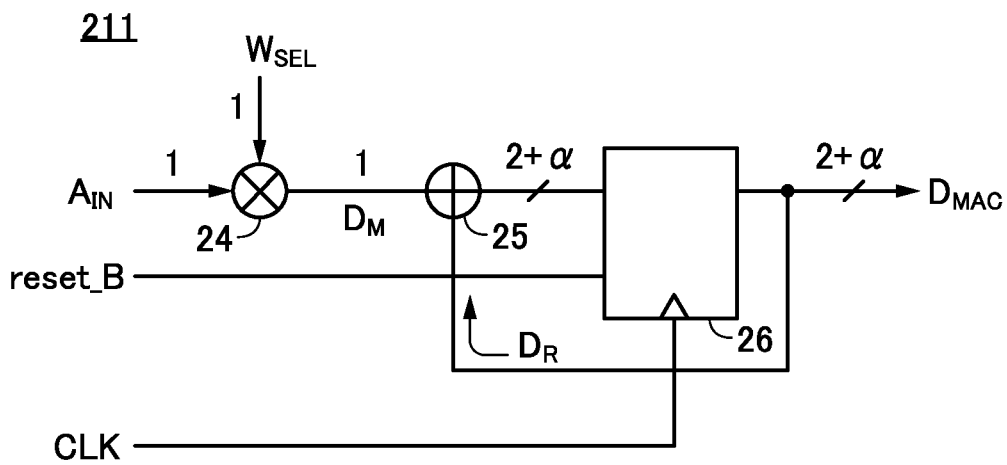

FIG. 6A illustrates the circuit configuration in which arithmetic processing is performed using 8-bit data. The arithmetic circuit 211 illustrated in FIG. 6A can be used for arithmetic processing using 1-bit data. The circuit configuration is illustrated in FIG. 6B as in FIG. 6A. When each of the weight data $W_{SEL}$ and the input data $A_{IN}$ is 1-bit data, the data $D_M$ generated in the multiplier circuit 24 is 1-bit data. Other arithmetic processing is the same as those described above, and thus more description thereof is omitted.

In the semiconductor device 100 according to one embodiment of the present invention, the weight data W used in the product-sum operation processing is retained in the memory circuit portion 310 provided to overlap with the arithmetic circuit portion 210. Thus, the wiring RBL used for reading out the weight data W can be shortened, whereby the wiring resistance and the parasitic capacitance become small, and the weight data W can be read out at high speed. In addition, power consumption needed for reading out the weight data W can be reduced.

Since the semiconductor device 100 according to one embodiment of the present invention includes the read word line driver circuit 230 for each arithmetic block 200, the weight data W can be read out at higher speed.

In addition, since the semiconductor device 100 according to one embodiment of the present invention includes the write bit line driver circuit 220 and the write word line driver circuit 240 for each arithmetic block 200, the weight data W can be written at high speed.

<Arithmetic Processing System>

Figure 7:
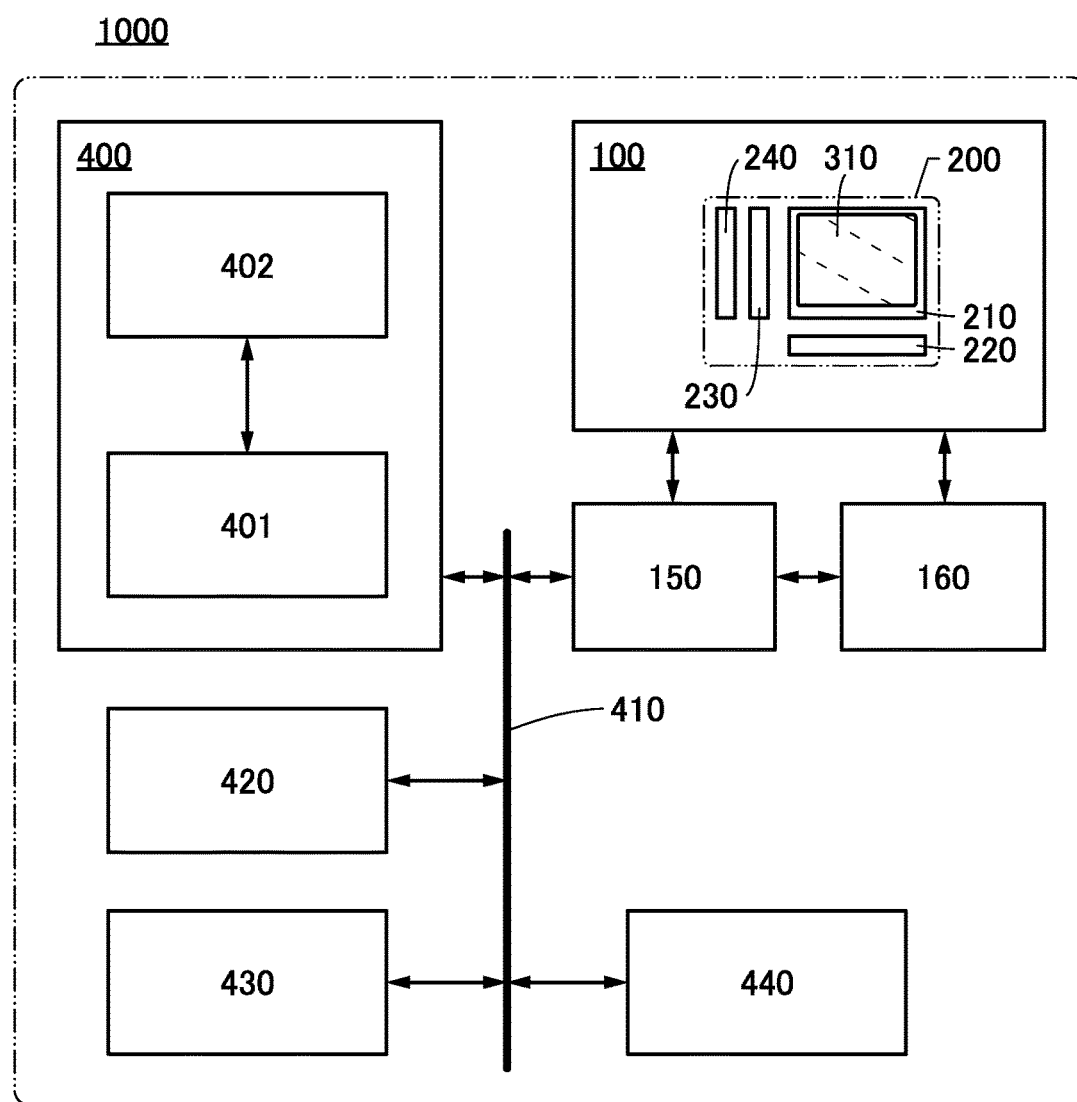
FIG. 7 is a block diagram illustrating a structure example of an arithmetic processing system.

FIG. 7 illustrates a block diagram of an arithmetic processing system 1000 including the semiconductor device 100 functioning as an AI accelerator.

The arithmetic processing system 1000 illustrated in FIG. 7 includes the semiconductor device 100, a CPU 400, a bus 410, a control device 150, and a memory device 160. A main memory device 420, an auxiliary memory device 430, an input/output device 440, and the like may also be included. The control device 150, the main memory device 420, the auxiliary memory device 430, the input/output device 440, and the like are electrically connected to the CPU 400 through the bus 410.

The CPU 400 includes a CPU core 401 and a backup circuit 402. Although the semiconductor device 100 includes the plurality of arithmetic blocks 200 as described above, FIG. 7 illustrates one arithmetic block 200.

The CPU 400 has a function of performing general-purpose processing such as execution of an operating system, control of data, and execution of various kinds of arithmetic operation and programs. The CPU 400 includes the CPU core 401. The CPU core 401 corresponds to one or a plurality of CPU cores. The CPU 400 includes the backup circuit 402 that can retain data stored in the CPU core 401 even when the supply of power supply voltage is stopped. The supply of power supply voltage can be controlled by electric isolation by a power switch or the like from a power domain. Note that power supply voltage is referred to as driving voltage in some cases.

For the backup circuit 402, it is preferable that an OS memory including an OS transistor be used, for example. The backup circuit 402 formed using an OS transistor can be stacked over the CPU core 401 that can be formed using a Si transistor. The area of the backup circuit 402 is smaller than that of the CPU core 401; thus, the backup circuit 402 can be placed over the CPU core 401 without an increase in the circuit area. The backup circuit 402 has a function of retaining data of a register included in the CPU core 401. The backup circuit 402 is also referred to as a data retention circuit. Note that a structure of the CPU 400 provided with the backup circuit 402 including the OS transistor will be described in details in Embodiment 3.

The control device 150 has a function of controlling operation of the semiconductor device 100 functioning as an AI accelerator. For example, the control device 150 has a function of supplying signals for controlling writing and reading of the weight data W to the semiconductor device 100. The control device 150 has a function of supplying the input data A to the semiconductor device 100 to make the semiconductor device 100 execute product-sum operation or the like of a neural network. The control device 150 is electrically connected to the CPU 400 through the bus 410. Thus, the semiconductor device 100 is electrically connected to the CPU 400 through the bus 410.

The memory device 160 has a function of retaining output data obtained in the semiconductor device 100, such as product-sum operation results of a neural network. As the memory device 160, a DRAM (Dynamic Random Access Memory), an SRAM (Static Random Access Memory), an OS memory, or the like can be used.

The main memory device 420 is preferably a memory which has a function of storing programs and parameters related to the operation of the arithmetic processing system 1000 and at least part of which is rewritable. For example, the main memory device 420 can include a volatile memory such as a RAM (Random Access Memory) or a nonvolatile memory such as a ROM (Read Only Memory). An OS memory may be used as the main memory device 420.

The auxiliary memory device 430 is a memory device that stores an operating system, an application program, various kinds of data, and the like. In addition, various parameters and the like used in the CPU 400 and the semiconductor device 100 are stored in some cases.

As the auxiliary memory device 430, for example, a memory device including a nonvolatile memory element, such as a flash memory, an MRAM, a PRAM, an ReRAM, or an FeRAM, or a memory device including a volatile memory element, such as a DRAM and/or an SRAM may be used. Alternatively, a memory media drive such as a hard disc drive (HDD) and/or a solid state drive (SSD) may be used, for example.

Alternatively, for example, a memory device that can be detached through the input/output device 440, such as an HDD or an SSD, may be used as the auxiliary memory device 430. Alternatively, a media drive for a recording medium such as a flash memory, a Blu-ray disc, or a DVD can be used as the auxiliary memory device 430.

The input/output device 440 has a function of controlling input and output of a signal between an external device and the arithmetic processing system 1000. In addition, an HDMI (registered trademark) terminal, a USB terminal, a LAN (Local Area Network) connection terminal, or the like may be used as an external port of the input/output device 440. Furthermore, the input/output device 440 may have a transmission and reception function for optical communication using infrared rays, visible light, ultraviolet rays, or the like.

[Examples of Arithmetic Processing]

Figure 8A:
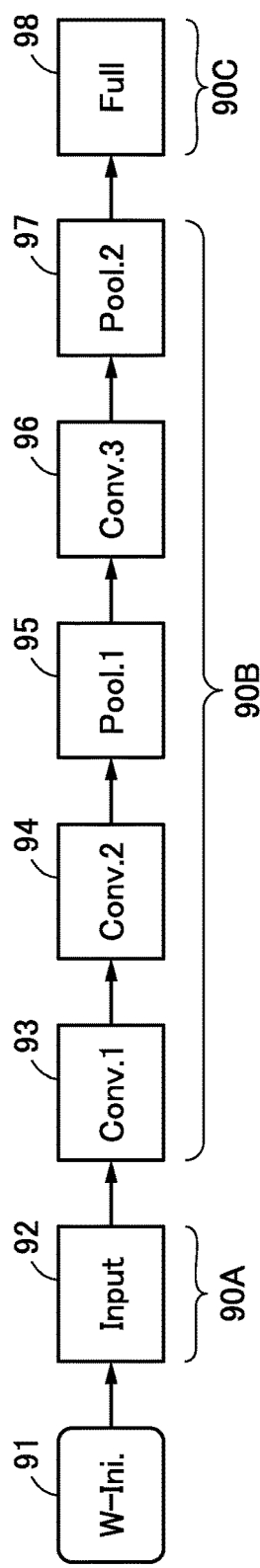
FIG. 8A is a block diagram showing an arithmetic processing sequence.
Figure 8B:
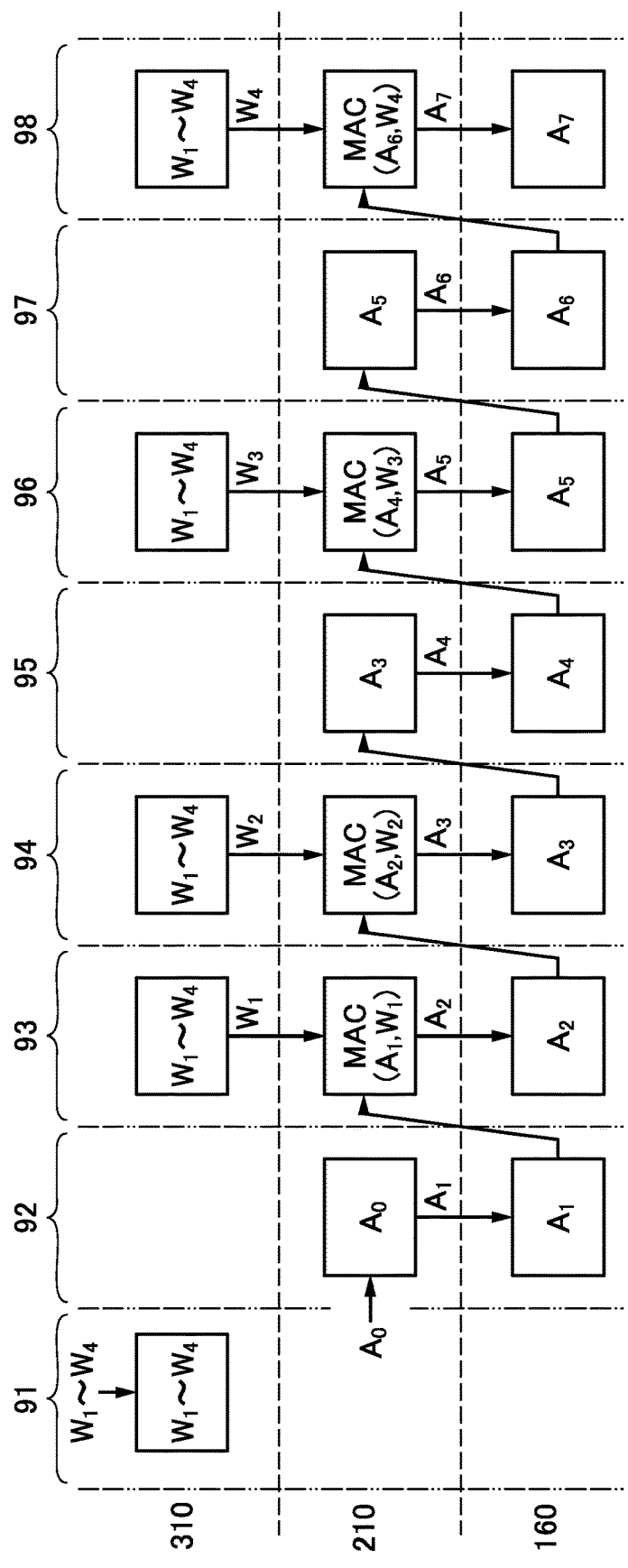
FIG. 8B is a diagram showing a data flow in the arithmetic processing.

An example of arithmetic processing of a convolutional neural network is described with reference to FIG. 8A and FIG. 8B. FIG. 8A is a block diagram showing an arithmetic processing sequence. FIG. 8B is a diagram showing a data flow (a flow of the input data A and the weight data W) of the sequence shown in FIG. 8A. FIG. 8B shows the data flow between the memory circuit portion 310, the arithmetic circuit portion 210, and the memory device 160.

FIG. 8A shows an input layer 90A, an intermediate layer (also referred to as a hidden layer) 90B, and an output layer 90C. In the input layer 90A, input processing 92 (denoted by "Input") of input data is shown. In the intermediate layer 90B, convolutional operation processing 93, convolutional operation processing 94, convolutional operation processing 96 (denoted by "Conv.1", "Conv.2", and "Conv.3"), pooling operation processing 95, and pooling operation processing 97 (denoted by "Pool.1" and "Pool.2") are shown. In the output layer 90C, fully connected operation processing 98 (denoted by "Full") is shown.

First, weight data initialization processing 91 (denoted by "W-Ini." in the drawing) is performed. In the weight data initialization processing 91, weight data $W_1$ to weight data $W_4$ retained in the main memory device 420 or the auxiliary memory device 430 are written to the memory circuit portion 310 of the arithmetic block 200 through the control device 150.

Next, the input processing 92 is performed. In the input processing 92, data $A_0$ retained in the main memory device 420 or the auxiliary memory device 430 is processed to generate data $A_1$ for performing the convolutional operation processing 93. The data $A_1$ is retained in the memory device 160. Note that data retained in the memory device 160 may be used as the data $A_0$.

Next, the convolutional operation processing 93 is performed. In the convolutional operation processing 93, product-sum operation processing (MAC) is performed by using the weight data $W_1$ and the data $A_1$ to generate data $A_2$. Specifically, the data $A_1$ is read out from the memory device 160, the data $A_1$ is input to the arithmetic block 200 to which the weight data $W_1$ is written, and then the product-sum operation processing is performed in the arithmetic block 200. The obtained data $A_2$ is retained in the memory device 160.

Next, the convolutional operation processing 94 is performed. In the convolutional operation processing 94, the product-sum operation processing is performed using the weight data $W_2$ and the data $A_2$ to generate data $A_3$. As in the convolutional operation processing 93, the data $A_2$ is read out from the memory device 160, the data $A_2$ is input to the arithmetic block 200 to which the weight data $W_2$ is written, and then the product-sum operation processing is performed in the arithmetic block 200. The obtained data $A_3$ is retained in the memory device 160.

Next, the pooling operation processing 95 is performed. Note that in the case where the pooling operation processing 95 is performed, the data $A_3$ obtained by the convolutional operation processing 94 may be directly subjected to the pooling operation processing without through the memory device 160. In the pooling operation processing 95, the data $A_3$ obtained by convolutional processing is compressed and converted into data that is more easily handled (down sampling). As the pooling operation processing, max pooling is performed. As the pooling operation processing, average pooling, Lp pooling, or the like may be used. Data $A_4$ is generated by the pooling operation processing 95. The obtained data $A_4$ is retained in the memory device 160.

Next, the convolutional operation processing 96 is performed. In the convolutional operation processing 96, the product-sum operation processing is performed using the weight data $W_3$ and the data $A_4$ to generate data $A_5$. As in the convolutional operation processing 94, the data $A_4$ is read out from the memory device 160, the data $A_4$ is input to the arithmetic block 200 to which the weight data $W_3$ is written, and then the product-sum operation processing is performed in the arithmetic block 200. The obtained data $A_5$ is retained in the memory device 160.

Next, the pooling operation processing 97 is performed. Note that in the case where the pooling operation processing 97 is performed, the data $A_5$ obtained by the convolutional operation processing 96 may be directly subjected to the pooling operation processing without through the memory device 160. In the pooling operation processing 97, pooling operation processing is performed on the data $A_5$ to generate data $A_6$. The obtained data $A_6$ is retained in the memory device 160. The generated data $A_6$ is data obtained by extracting a feature value of the data $A_0$.

Next, the fully connected operation processing 98 is performed. The data $A_6$ is data obtained by extracting a feature value of the data $A_0$ and thus cannot be classified or identified by itself. In the fully connected operation processing 98, product-sum operation processing is performed by using the weight data $W_4$ and the data $A_6$ to generate data $A_7$. For example, with the use of a softmax function, the data $A_7$ can be converted into probability of classification into each class accurately.

The flow of the arithmetic processing in the input layer 90A, the intermediate layer 90B, and the output layer 90C is an example, and it is possible that another arithmetic processing is performed in actual arithmetic processing of a convolutional neural network.

In the arithmetic processing system 1000 including the semiconductor device 100, it is not necessary to perform the weight data initialization processing 91 again at the time of performing the second and subsequent arithmetic processing of a convolutional neural network. Thus, the power consumption and processing time required for the weight data initialization processing 91 can be reduced.

The semiconductor device 100 according to one embodiment of the present invention can write all the pieces of weight data W that are used in arithmetic processing of a convolutional neural network to a memory array (the memory circuit portion 310) and can retain the weight data W. The weight data W does not need to be written to the semiconductor device 100 according to one embodiment of the present invention every time product-sum operation processing (e.g., convolutional operation processing) is performed, so that the arithmetic processing can be performed at higher speed.

When a large amount of weight data is supplied to an arithmetic circuit array (the arithmetic circuit portion 210) through the bus 410, the band width of the bus 410 needs to be increased. When the connection through the bus 410 is a one-dimensional connection, in the semiconductor device 100 according to one embodiment of the present invention, the arithmetic circuit portion 21 and the memory circuit portion 310 are provided to overlap with each other, whereby a two-dimensional connection can be achieved. That is, in the semiconductor device 100 according to one embodiment of the present invention, the band width can be easily increased. In addition, in the semiconductor device 100 according to one embodiment of the present invention, the parallel number of the arithmetic circuits is also easily increased.

As shown in FIG. 9A and FIG. 9B, weight data initialization processing 99 may be performed during the execution of the convolutional operation processing 96 to convert the content of the memory circuit portion 310 to which the data $W_1$ is written into the data $W_4$. As described above, in the semiconductor device 100 according to one embodiment of the present invention, the weight data W writing speed is high. Thus, even the arithmetic processing shown in FIG. 9A and FIG. 9B can be performed at high speed.

Figure 10A:
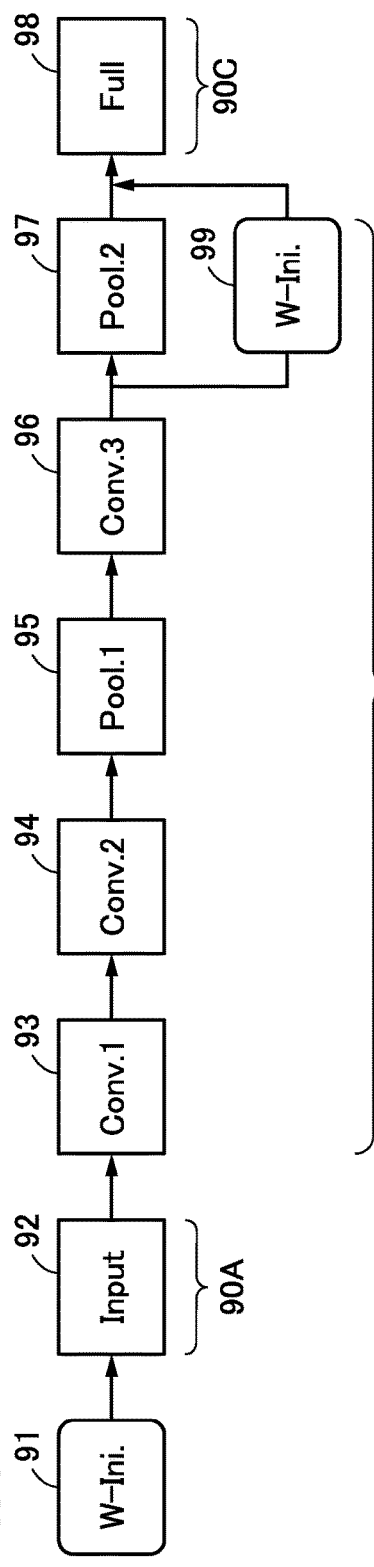
FIG. 10A is a block diagram showing an arithmetic processing sequence.
Figure 10B:
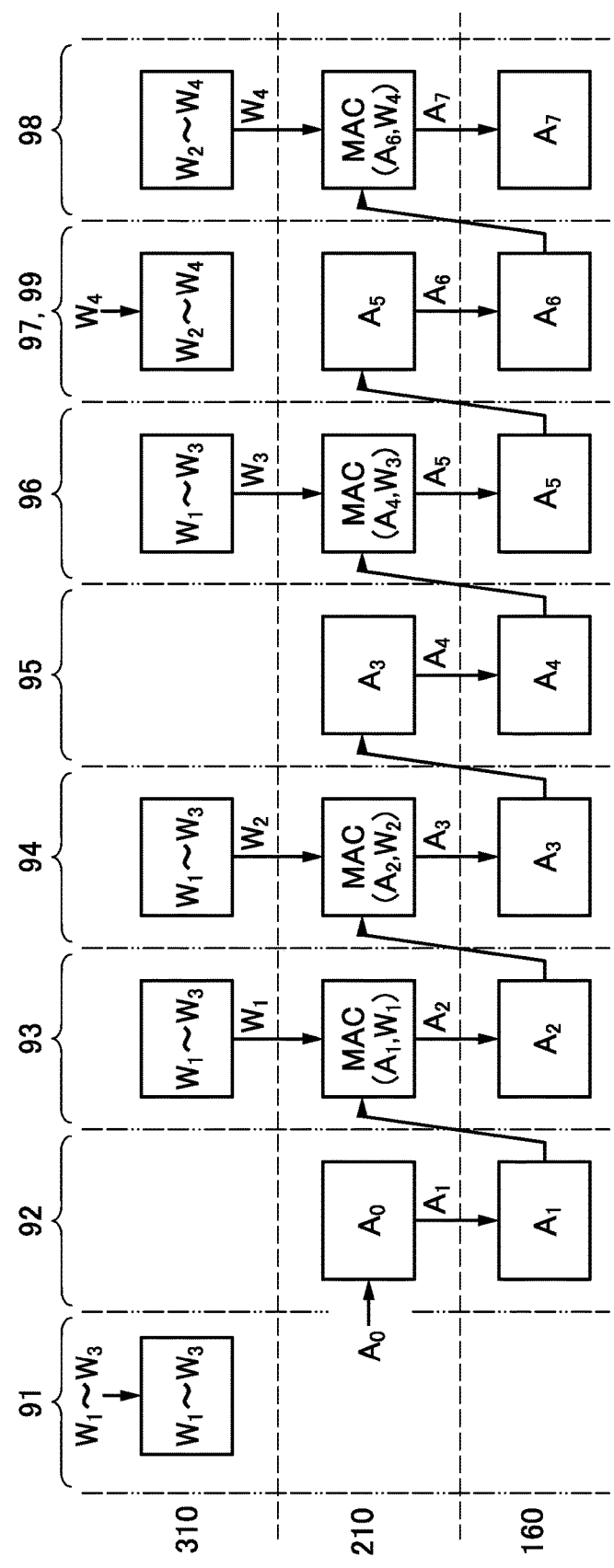
FIG. 10B is a diagram showing a data flow in the arithmetic processing.

Since the data $W_4$ is used in the fully connected operation processing 98, the weight data initialization processing 99 is finished before the start of the fully connected operation processing 98. FIG. 10A and FIG. 10B show a sequence and a data flow in the case of performing the weight data initialization processing 99 during the execution of the pooling operation processing 97.

The sequences shown in FIG. 9 and FIG. 10 are effective when the capacity of the entire weight data W (in this embodiment, a total of the weight data $W_1$ to the weight data $W_4$) is greater than the storage capacity of the memory array.

The semiconductor device 100 according to one embodiment of the present invention can perform not only the arithmetic processing of the convolutional neural network but also various kinds of arithmetic processing.

<Modification Example 1 of Semiconductor Device>

Figure 11:
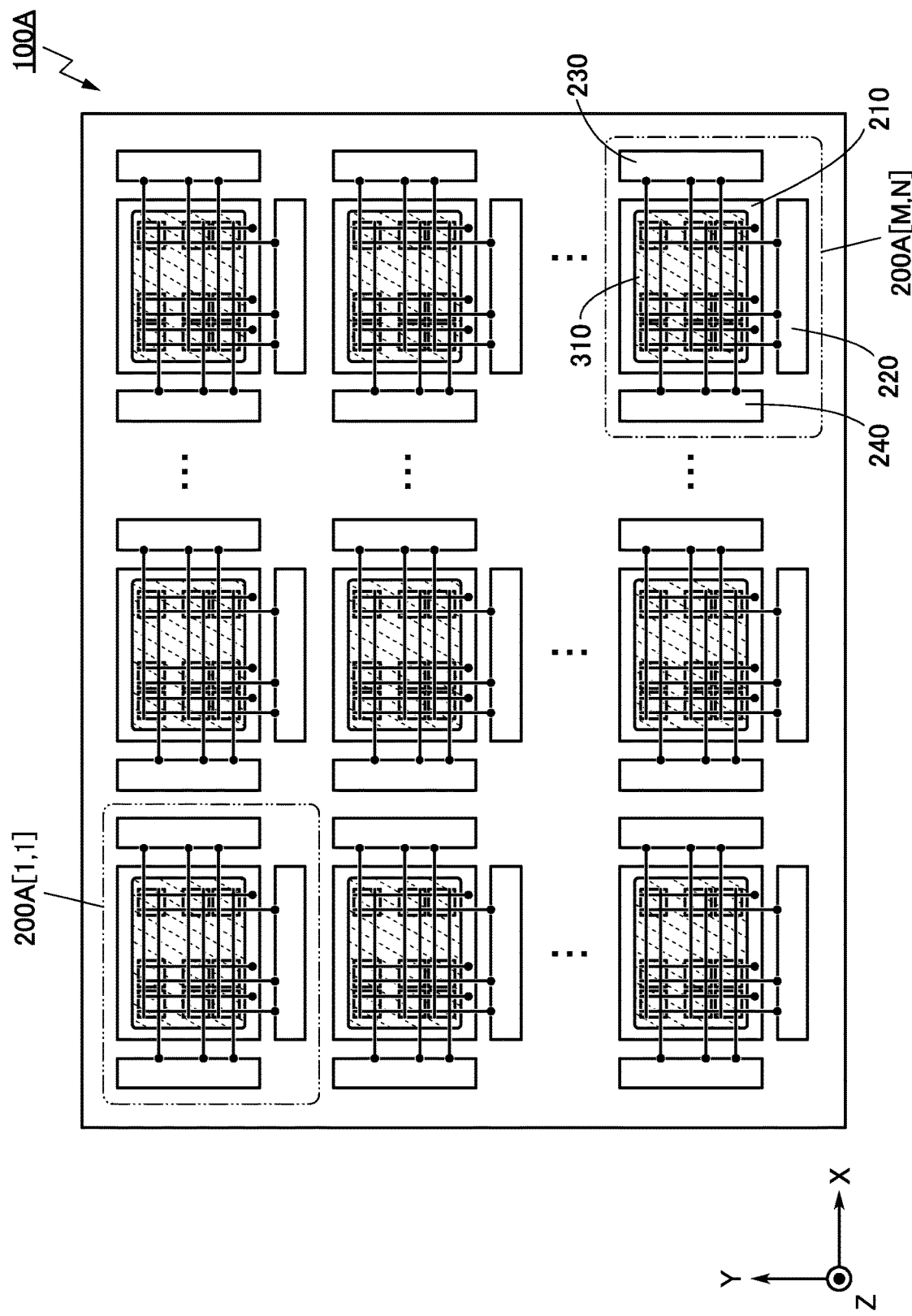
FIG. 11 is a diagram illustrating a modification example of a semiconductor device.

FIG. 11 illustrates a top view of a semiconductor device 100A. The semiconductor device 100A is a modification example of the semiconductor device 100. In order to reduce repeated description, differences of the semiconductor device 100A from the semiconductor device 100 are mainly described.

The semiconductor device 100A includes a plurality of arithmetic blocks 200A arranged in a matrix of M rows and N columns (M and N are each a natural number greater than or equal to 2). As in the arithmetic block 200A illustrated in FIG. 11, the write word line driver circuit 240 and the read word line driver circuit 230 may be arranged to face each other with the memory circuit portion 310 sandwiched therebetween.

<Modification Example 2 of Semiconductor Device>

Figure 12:
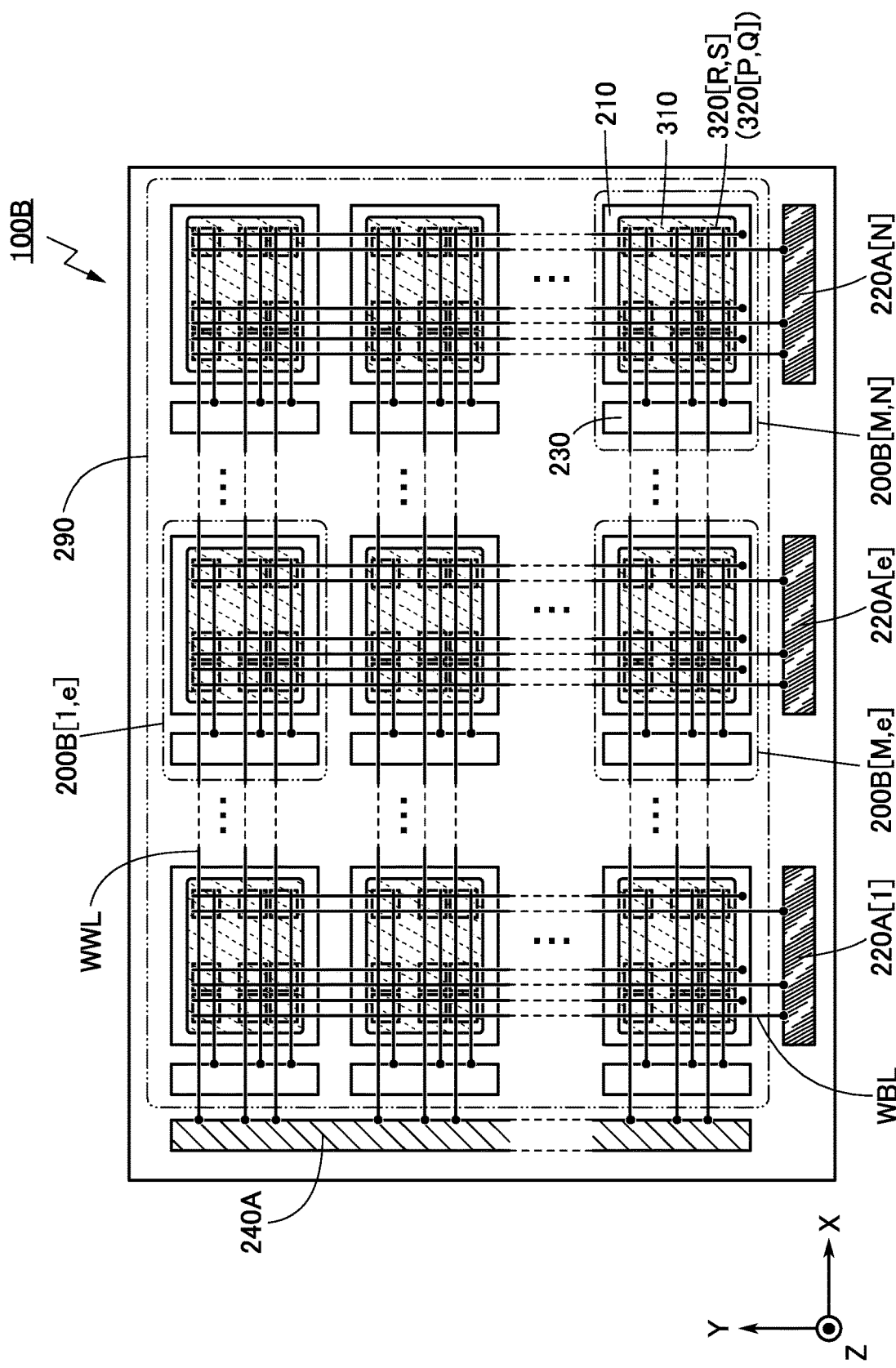
FIG. 12 is a diagram illustrating a modification example of a semiconductor device.

FIG. 12 illustrates a top view of a semiconductor device 100B. The semiconductor device 100B is a modification example of the semiconductor device 100. In order to reduce repeated description, differences of the semiconductor device 100B from the semiconductor device 100 are mainly described.

The semiconductor device 100B includes an arithmetic block array 290 including a plurality of arithmetic blocks 200B arranged in a matrix of M rows and N columns (M and N are each a natural number greater than or equal to 2), a write word line driver circuit 240A, and N write bit line driver circuits 220A.

The arithmetic block 200B includes the arithmetic circuit portion 210, the read word line driver circuit 230, and the memory circuit portion 310. The arithmetic block 200B has a structure in which the write bit line driver circuit 220A and the write word line driver circuit 240 are removed from the arithmetic block 200.

As in the semiconductor device 100, the memory circuit portion 310 includes the memory cells 320 in P rows and Q columns. Thus, the memory array of the semiconductor device 100B includes the memory cells 320 in R rows and S columns. In FIG. 12, the memory cell 320 in the R-th row and the S-th column is denoted by a memory cell 320[R,S]. Note that the memory cell 320[R,S] corresponds to the memory cell[P,Q] in the arithmetic block 200B[M,N].

The write word line driver circuit 240A is provided outside the arithmetic block array 290. The write word line driver circuit 240A extends in the column direction and is electrically connected to the R wirings WWL extending in the row direction (Y direction). The g-th (g is a natural number greater than or equal to 1 and less than or equal to R) wiring WWL is electrically connected to the S memory cells 320 arranged in the g-th row.

The write word line driver circuit 240A has a function of controlling writing operation of all the arithmetic blocks 200B included in the semiconductor device 100B. For example, the write word line driver circuit 240A has a function of controlling operation of writing the weight data W to the memory circuit portion 310 in the arithmetic block 200B. Providing the write word line driver circuit 240A can omit the M×N write word line driver circuits 240 included in the semiconductor device 100. The area occupied by the semiconductor device 100B can be smaller than that occupied by the semiconductor device 100.

In FIG. 12, the N write bit line driver circuits 220A are provided outside the arithmetic block array 290. The write bit line driver circuits 220A each extend in the row direction (X direction). The N write bit line driver circuits 220A are continuously arranged in the row direction. Each of the write bit line driver circuits 220A is arranged in columns of the corresponding arithmetic block 200B.

In FIG. 12, the write bit line driver circuit 220A arranged in the first position (the first column) is denoted by a "write bit line driver circuit 220A[1]", and the write bit line driver circuit 220A arranged in the N-th position (the N-th column) is denoted by a "write bit line driver circuit 220A[N]". The write bit line driver circuit 220A arranged in the e-th position (the e-th column) (e is a natural number greater than or equal to 1 and less than or equal to N) is denoted by a "write bit line driver circuit 220A[e]".

In FIG. 12, the arithmetic block 200B in the first row and the e-th column is denoted by an "arithmetic block 200B[1,e]", and the arithmetic block 200B in the M-th row and the e-th column is denoted by an "arithmetic block 200B[M,e]".

The write bit line driver circuit 220A[e] is electrically connected to the arithmetic blocks 200B arranged in the e-th column through the Q wirings WBL extending in the column direction (Y direction). In other words, the write bit line driver circuit 220A[e] is electrically connected to the memory circuit portion 310 included in each of the arithmetic blocks 200B arranged in the e-th column. More accurately, the j-th wiring WBL among the Q wirings WBL electrically connected to the write bit line driver circuit 220A[e] is electrically connected to the memory cells 320 in the j-th column included in the memory circuit portion 310 that is included in each of the arithmetic blocks 200B arranged in the e-th column. That is, the j-th wiring WBL electrically connected to the write bit line driver circuit 220A[e] is electrically connected to the memory cell 320[1, j] to the memory cell 320[P,j] that are included in the arithmetic block 200B[1,e] to the arithmetic block 200B[M,e].

The write bit line driver circuit 220A[e] has a function of supplying data to all the arithmetic blocks 200B arranged in the e-th column. For example, the write bit line driver circuit 220A[e] has a function of supplying the weight data W to all the memory circuit portions 310 arranged in the e-th column. Providing the write bit line driver circuit 220A can omit the M×N write bit line driver circuits 220 included in the semiconductor device 100. The area occupied by the semiconductor device 100B can be smaller than that occupied by the semiconductor device 100.

The area occupied by the semiconductor device 100B can be smaller than that occupied by the semiconductor device 100. Meanwhile, time for writing the weight data W is long in the semiconductor device 100B as compared with that in the semiconductor device 100. However, as described with reference to FIG. 8, when the weight data W is written only once at the start of the arithmetic processing, a ratio of the writing time to the total arithmetic operation time might be extremely low even when the time needed for writing the weight data W is somewhat long. In such a case, the structure of the semiconductor device 100B is preferably used.

<Modification Example 3 of Semiconductor Device>

Figure 13:
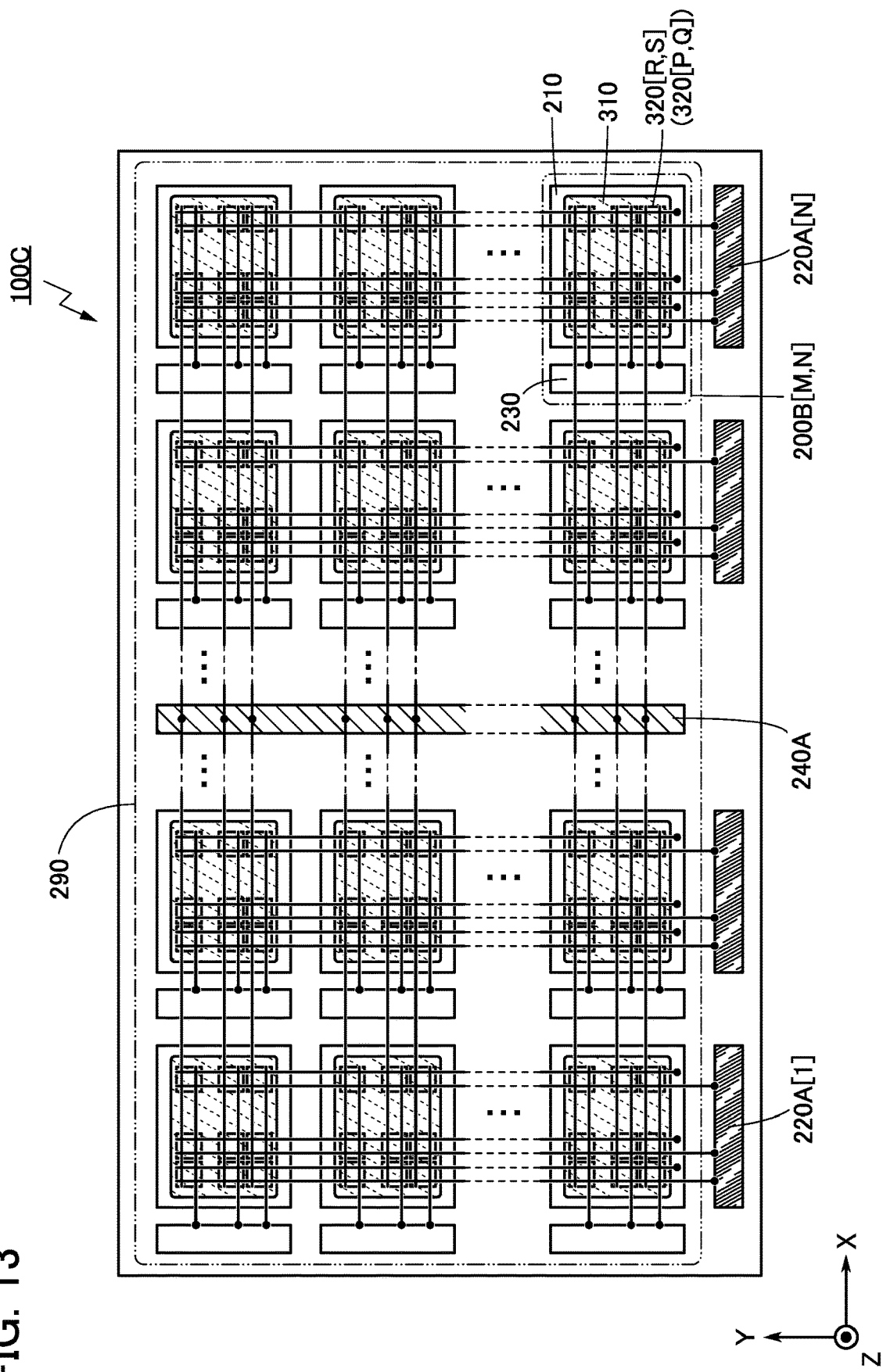
FIG. 13 is a diagram illustrating a modification example of a semiconductor device.

FIG. 13 illustrates a top view of a semiconductor device 100C. The semiconductor device 100C is a modification example of the semiconductor device 100B. As in the semiconductor device 100C, the write word line driver circuit 240A may be provided inside the arithmetic block array 290.

The write word line driver circuit 240A is preferably provided at the center or near the center of the arithmetic blocks 200B in N columns when provided inside the arithmetic block array 290. For example, in the case where N is an even number, the write word line driver circuit 240A is preferably provided between the arithmetic blocks 200B in the N/2-th column and the arithmetic blocks 200B in the (N/2)+1-th column. In the case where N is an odd number, the write word line driver circuit 240A is preferably provided between the arithmetic blocks 200B in the (N/2)−0.5-th column and the arithmetic blocks 200B in the (N/2)+0.5-th column. Alternatively, it is preferable that the write word line driver circuit 240A be provided adjacent to the arithmetic blocks 200B in the range of N×0.4-th column to N×0.6-th column.

By providing the write word line driver circuit 240A at the center or near the center of the arithmetic block array 290, the maximum connection distance between the write word line driver circuit 240A and the arithmetic block 200B is shortened. Thus, the maximum connection distance between the write word line driver circuit 240A and the memory cell 320 is shortened. When the maximum connection distance is shortened, effects such as a reduction in power consumption, an increase in operation speed, a reduction in variations, and an increase in reliability can be obtained.

<Modification Example 4 of Semiconductor Device>

Figure 14:
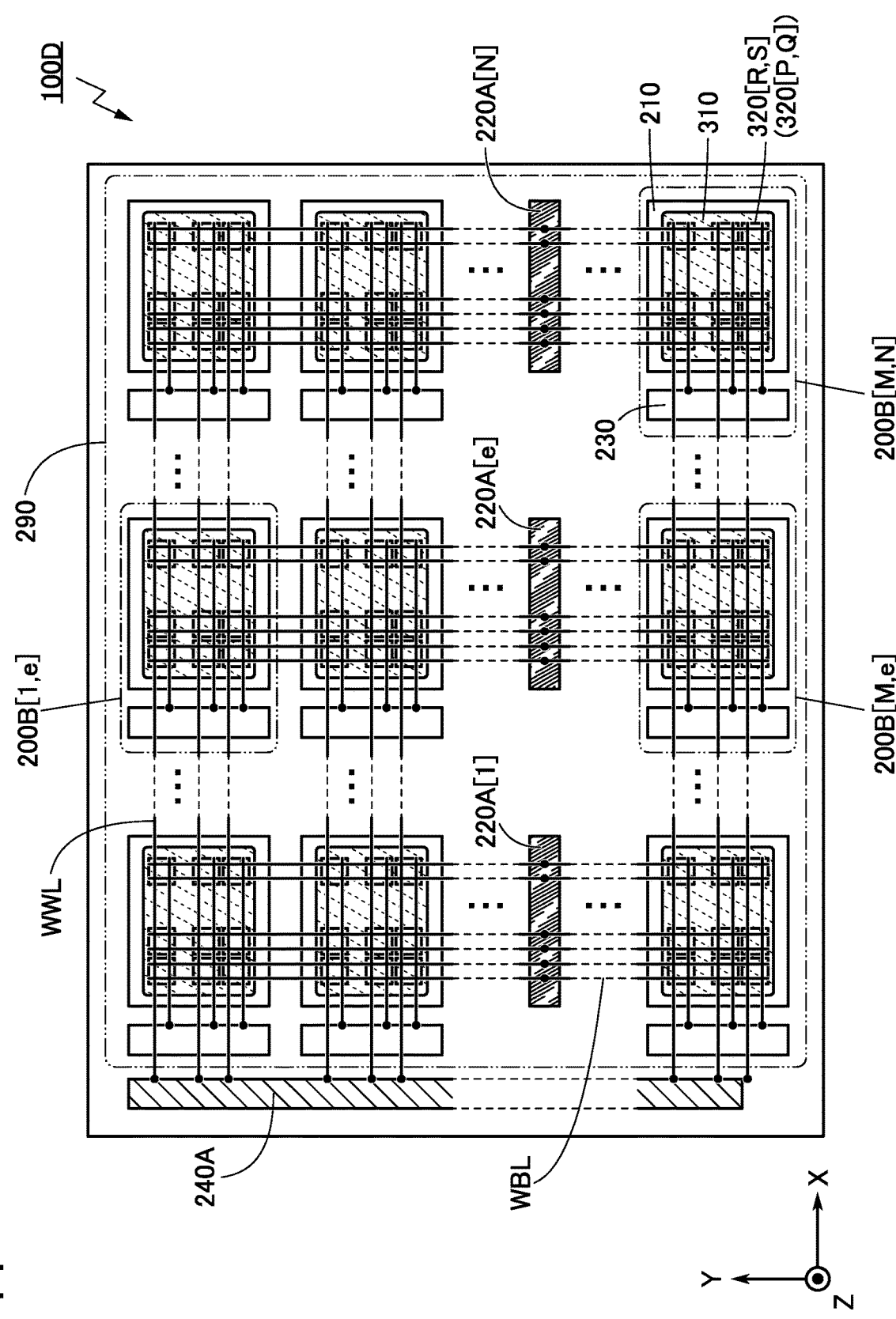
FIG. 14 is a diagram illustrating a modification example of a semiconductor device.

FIG. 14 illustrates a top view of a semiconductor device 100D. The semiconductor device 100D is a modification example of the semiconductor device 100B. As in the semiconductor device 100D, the write word line driver circuit 220A may be provided inside the arithmetic block array 290.

The write bit line driver circuit 220A is preferably provided at the center or near the center of the arithmetic blocks 200B in M rows when provided inside the arithmetic block array 290. For example, in the case where M is an even number, the write word line driver circuit 220A is preferably provided between the arithmetic blocks 200B in the M/2-th row and the arithmetic blocks 200B in the (M/2)+1-th row. In the case where M is an odd number, the write word line driver circuit 220A is preferably provided between the arithmetic blocks 200B in the (M/2)−0.5-th row and the arithmetic blocks 200B in the (M/2)+0.5-th row. Alternatively, it is preferable that the write bit line driver circuit 220A be provided adjacent to the arithmetic blocks 200B in the range of M×0.4-th row to M×0.6-th row.

By providing the write bit line driver circuit 220A at the center or near the center of the arithmetic block array 290, the maximum connection distance between the write bit line driver circuit 220A and the arithmetic block 200B is shortened. Thus, the maximum connection distance between the write bit line driver circuit 220A and the memory cell 320 is shortened. When the maximum connection distance is shortened, effects such as a reduction in power consumption, an increase in operation speed, a reduction in variations, and an increase in reliability can be obtained.

<Modification Example 5 of Semiconductor Device>

Figure 15:
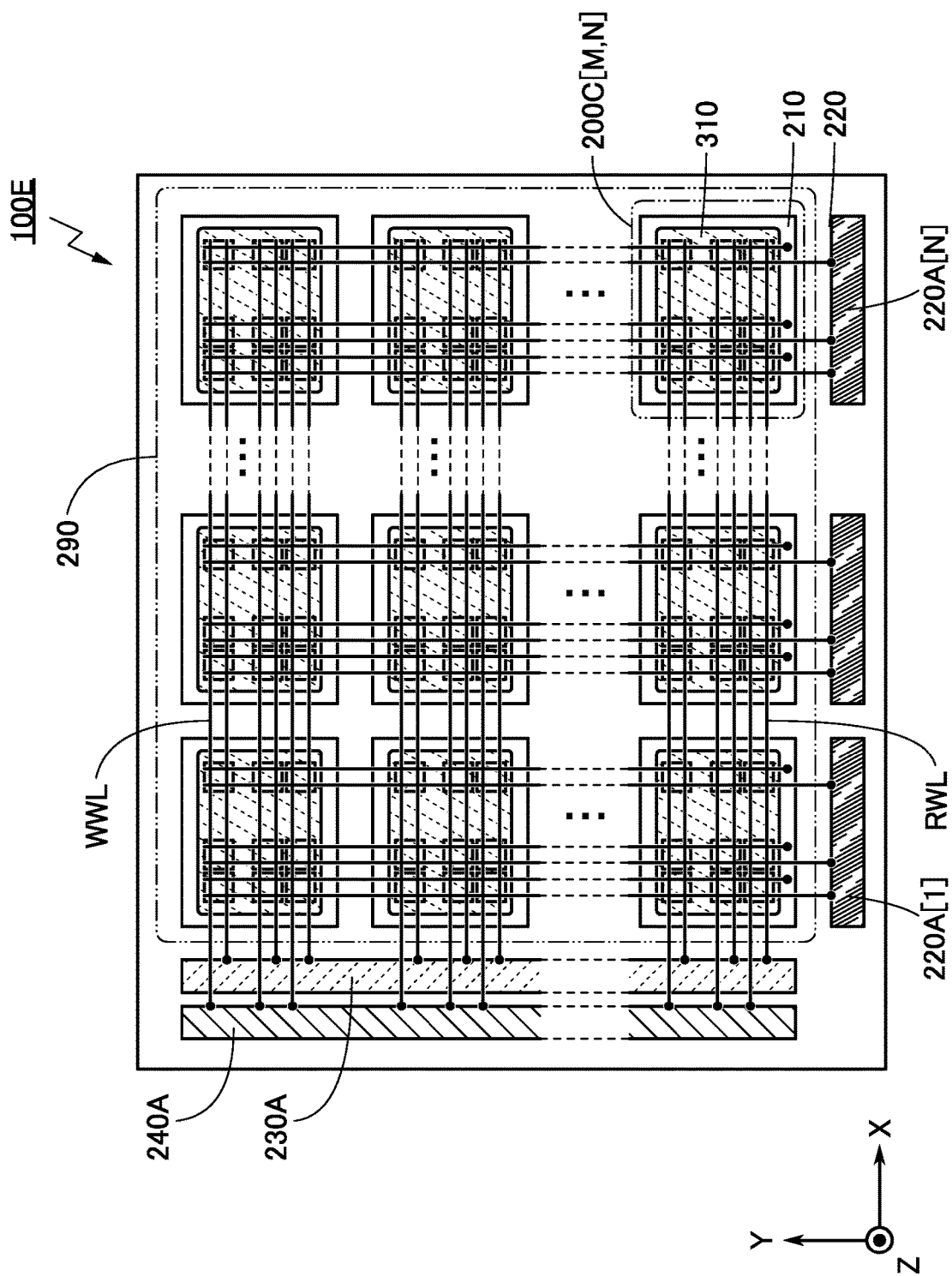
FIG. 15 is a diagram illustrating a modification example of a semiconductor device.

FIG. 15 illustrates a top view of a semiconductor device 100E. The semiconductor device 100E is a modification example of the semiconductor device 100B. In order to reduce repeated description, differences of the semiconductor device 100E from the semiconductor device 100B are mainly described.

The semiconductor device 100E includes the arithmetic block array 290 including a plurality of arithmetic blocks 200C arranged in a matrix of M rows and N columns (M and N are each a natural number greater than or equal to 2), the write word line driver circuit 240A, the read word line driver circuit 230A, and the N write bit line driver circuits 220A. As in the semiconductor device 100B, the memory array includes the memory cells 320 arranged in a matrix of R rows and S columns in the semiconductor device 100E.

The arithmetic block 200C includes the arithmetic circuit portion 210 and the memory circuit portion 310. The arithmetic block 200C has a structure in which the read word line driver circuit 230 is removed from the arithmetic block 200B.

Like the write word line driver circuit 240A, the read word line driver circuit 230A is provided outside the arithmetic block array 290. The read word line driver circuit 230A extends in the column direction and is electrically connected to the R wirings RWL extending in the row direction. The g-th wiring RWL is electrically connected to the S memory cells 320 arranged in the g-th row.

The read word line driver circuit 230A has a function of controlling reading operation of all the arithmetic blocks 200C included in the semiconductor device 100E. For example, the read word line driver circuit 230A has a function of controlling operation of reading out the weight data W from the memory circuit portion 310 in the arithmetic block 200C. Providing the read word line driver circuit 230A can omit the M×N read word line driver circuits 230 included in the semiconductor device 100B. The area occupied by the semiconductor device 100E can be smaller than that occupied by the semiconductor device 100B.

<Modification Example 6 of Semiconductor Device>

Figure 16:
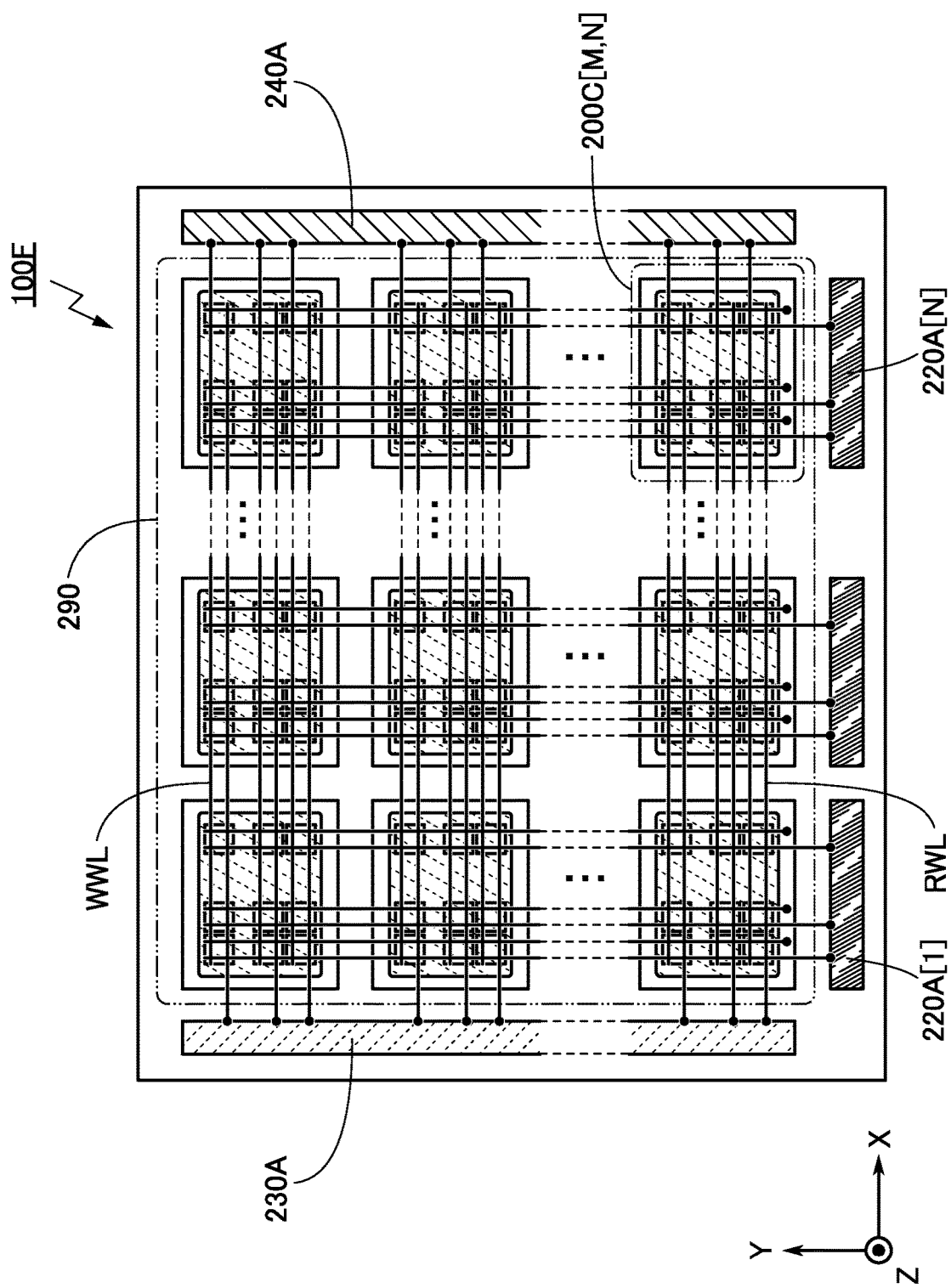
FIG. 16 is a diagram illustrating a modification example of a semiconductor device.

FIG. 16 illustrates a top view of a semiconductor device 100F. The semiconductor device 100F is a modification example of the semiconductor device 100E. As in the semiconductor device 100F illustrated in FIG. 16, the write word line driver circuit 240A and the read word line driver circuit 230A may be provided to face each other with the arithmetic block array 290 sandwiched therebetween.

<Modification Example 7 of Semiconductor Device>

Figure 17:
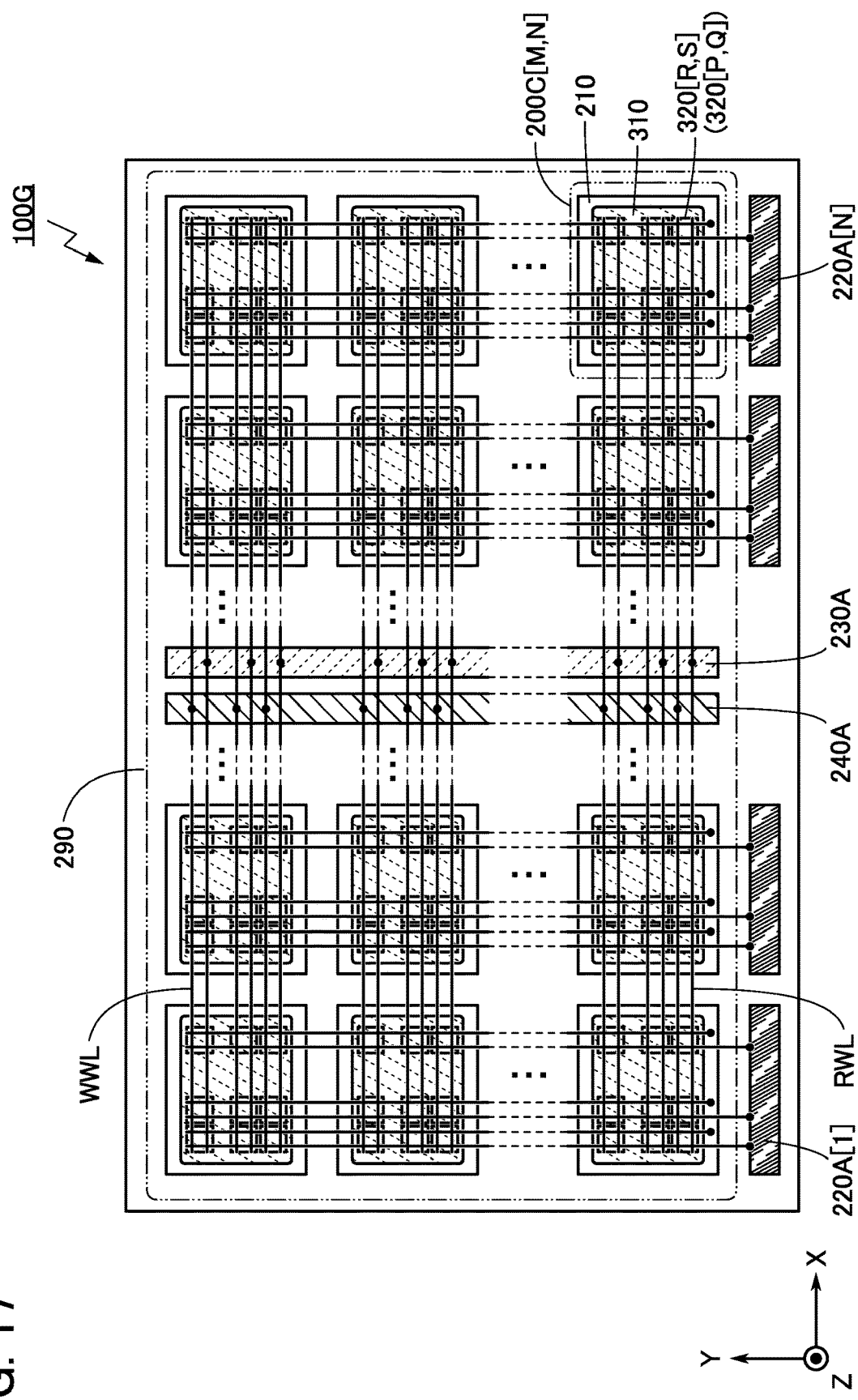
FIG. 17 is a diagram illustrating a modification example of a semiconductor device.

FIG. 17 illustrates a top view of a semiconductor device 100G. The semiconductor device 100G is a modification example of the semiconductor device 100E. As in the semiconductor device 100G, the write word line driver circuit 240A and the read word line driver circuit 230A may be provided inside the arithmetic block array 290.

The write word line driver circuit 240A and the read word line driver circuit 230A are preferably provided at the center or near the center of the arithmetic blocks 200C in N columns when provided inside the arithmetic block array 290. For example, in the case where N is an even number, the write word line driver circuit 240A and the read word line driver circuit 230A are preferably provided between the arithmetic blocks 200C in the N/2-th column and the arithmetic blocks 200C in the (N/2)+1-th column. In the case where N is an odd number, the write word line driver circuit 240A and the read word line driver circuit 230A are preferably provided between the arithmetic blocks 200C in the (N/2)−0.5-th column and the arithmetic blocks 200C in the (N/2)+0.5-th column. Alternatively, it is preferable that the write word line driver circuit 240A be provided adjacent to the arithmetic blocks 200C in the range of N×0.4-th column to N×0.6-th column.

By providing the write word line driver circuit 240A and the read word line driver circuit 230A at the center or near the center of the arithmetic block array 290, the maximum connection distances between the arithmetic blocks 200C and each of the write word line driver circuit 240A and the read word line driver circuit 230A is shortened. Thus, the maximum connection distance between the write word line driver circuit 240A and the read word line driver circuit 230A and the memory cell 320 is shortened. When the maximum connection distance is shortened, effects such as a reduction in power consumption, an increase in operation speed, a reduction in variations, and an increase in reliability can be obtained.

The composition, structure, method, and the like described in this embodiment can be used in combination as appropriate with the compositions, structures, methods, and the like described in the other embodiments and the like.

Embodiment 2

In this embodiment, an example of operation of the case where the semiconductor device 100 functioning as the accelerator executes part of arithmetic operation of a program executed by the CPU 400 described in the above embodiment is described.

Figure 18:
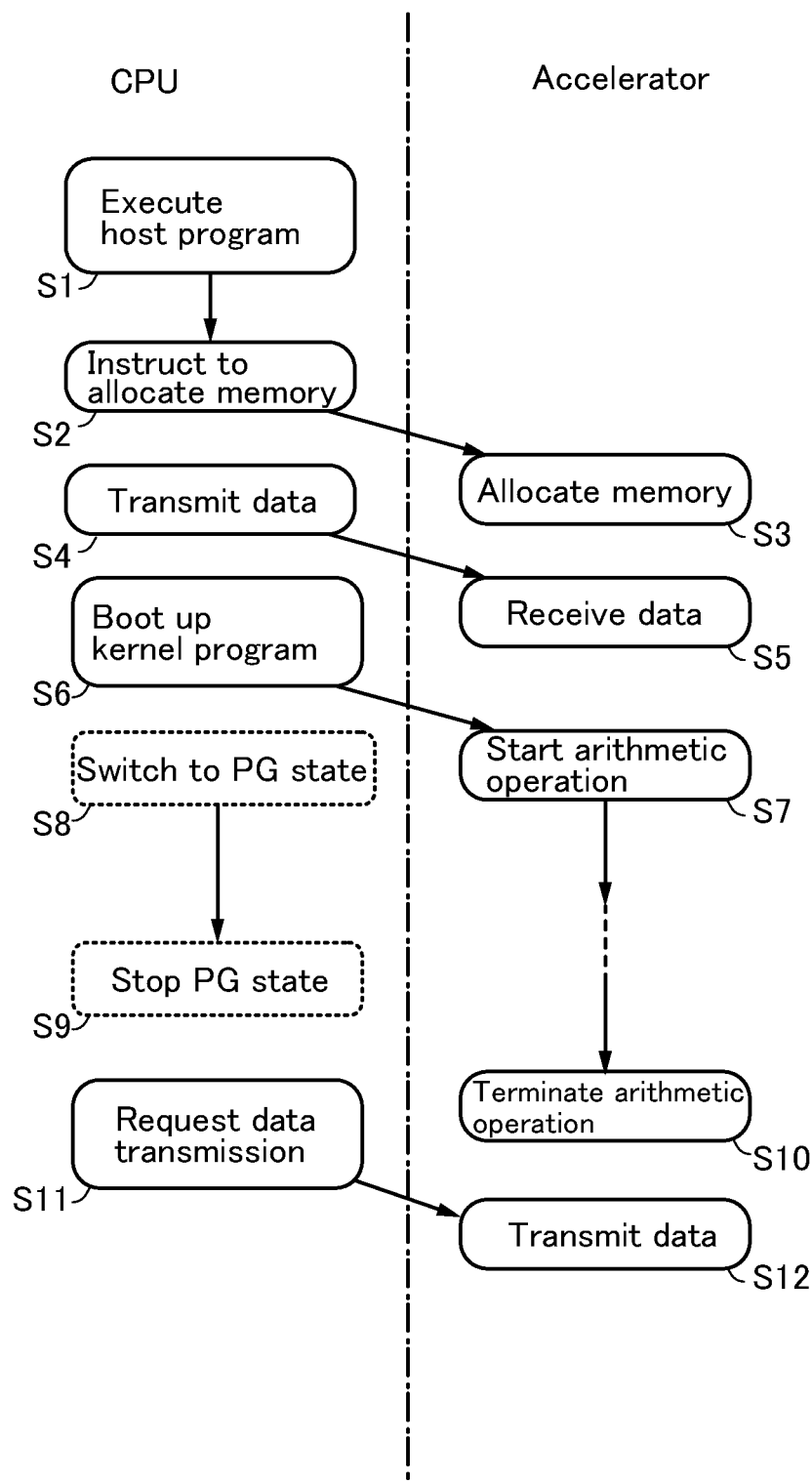
FIG. 18 is a diagram showing an operation example of an arithmetic processing system.

FIG. 18 shows an example of operation of the case where the accelerator (semiconductor device 100) executes part of arithmetic operation of a program executed by the CPU.

First, a host program is executed by the CPU (Execution of the host program: Step S1).

In the case where the CPU confirms an instruction to allocate, to a memory circuit portion (the memory circuit portion 310), a region for data needed in performing an arithmetic operation using the accelerator (Instruct to allocate memory: Step S2), the CPU allocates the region for the data to the memory circuit portion (Allocate memory: Step S3).

Next, the CPU transmits weight data that is data to be input from the main memory or an external memory device to the memory circuit portion (Transmit data: Step S4). The above-described memory circuit portion receives the weight data and stores the weight data in the region allocated in Step S2 (Receive data: Step S5).

In the case where the CPU confirms an instruction to boot up a kernel program (Boot up kernel program: Step S6), the accelerator starts execution of the kernel program (Start arithmetic operation: Step S7).

Immediately after the accelerator starts the execution of the kernel program, the CPU may be switched from the state of performing arithmetic operation to a PG (power gating) state (Switch to PG state: Step S8). In that case, just before the accelerator terminates the execution of the kernel program, the CPU is switched from the PG state to a state of performing arithmetic operation (Stop PG state: Step S9). By bringing the CPU into the PG state during the period from Step S8 to Step S9, the power consumption and heat generation of the arithmetic processing system as a whole can be inhibited.

When the accelerator terminates the execution of the kernel program, the output data is stored in a memory portion in the accelerator, which retains arithmetic operation results (Terminate arithmetic operation: Step S10).

After the execution of the kernel program is terminated, in the case where the CPU confirms an instruction to transmit the output data stored in the memory portion to the main memory or the external memory device (Request data transmission: Step S11), the above-described output data is transmitted to the main memory or the external memory device and stored in the main memory or the external memory device (Transmit data: Step S12).

By repeating the operations from Step S1 to Step S14 described above, part of the arithmetic operation executed by the CPU can be executed by the accelerator while the power consumption and heat generation of the CPU and the accelerator are inhibited. The semiconductor device of one embodiment of the present invention has a non-von Neumann architecture and can perform arithmetic processing with extremely low power consumption as compared with a von Neumann architecture, in which power consumption increases with increasing processing speed.

The composition, structure, method, and the like described in this embodiment can be used in combination as appropriate with the compositions, structures, methods, and the like described in the other embodiments and the like.

Embodiment 3

In this embodiment, an example of a CPU including a CPU core capable of power gating will be described.

Figure 19:
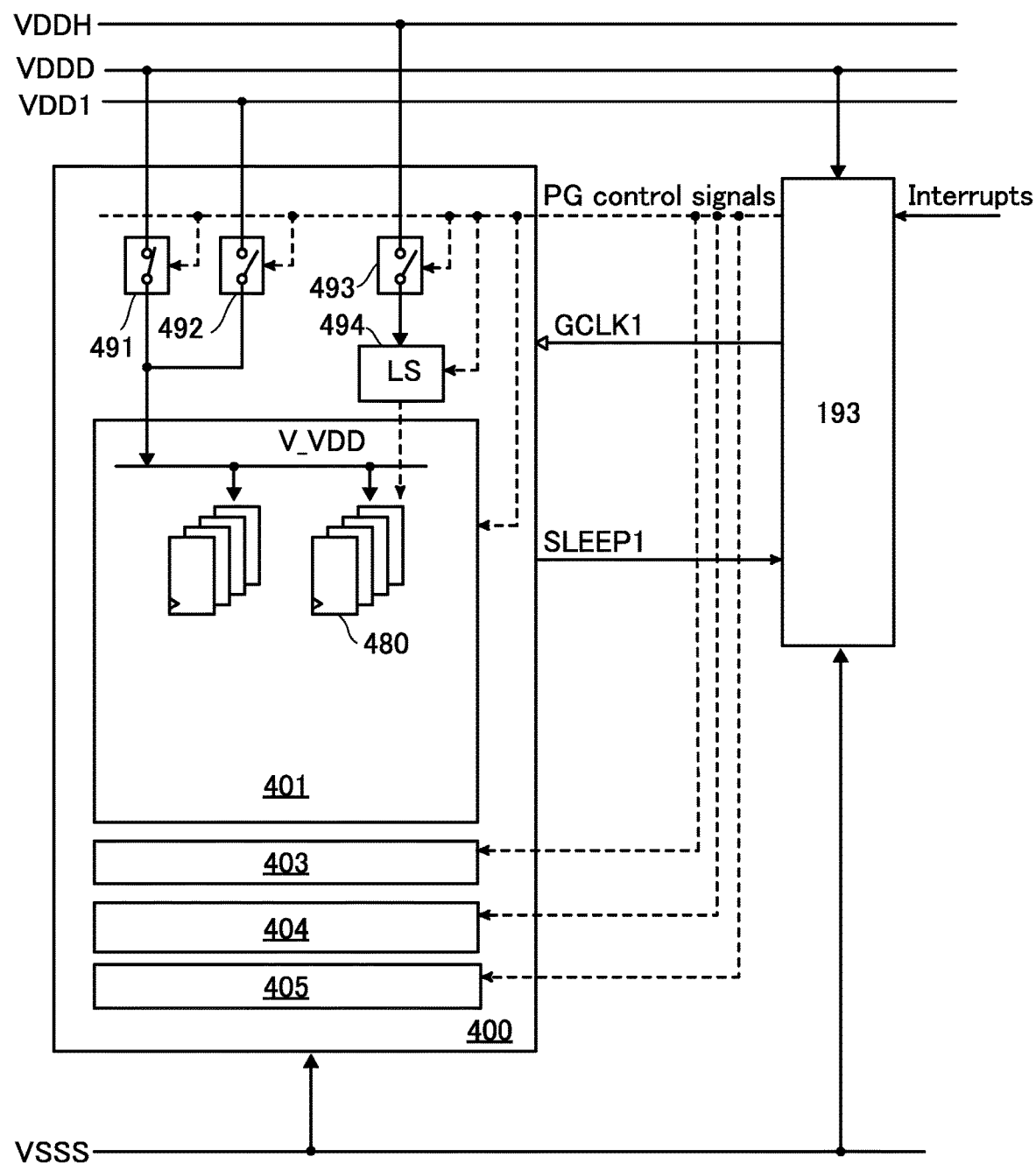
FIG. 19 is a diagram illustrating a structure example of a CPU.

FIG. 19 illustrates a structure example of the CPU 400. The CPU 400 includes the CPU core 401, an L1 (level 1) cache memory device (L1 Cache) 403, an L2 cache memory device (L2 Cache) 404, a bus interface portion (Bus I/F) 405, power switches 491 to 493, and a level shifter 494 (LS). The CPU core 401 includes a flip-flop 480.

Through the bus interface portion 405, the CPU core 401, the L1 cache memory device 403, and the L2 cache memory device 404 are mutually connected to one another.

A PMU 193 generates a clock signal GCLK1 and various PG (power gating) control signals in response to signals such as an interrupt signal (Interrupts) input from the outside and a signal SLEEP1 issued from the CPU 400. The clock signal GCLK1 and the PG control signal are input to the CPU 400. The PG control signal controls the power switches 491 to 493 and the flip-flop 480.

The power switches 491 and 492 control application of voltages VDDD and VDD1 to a virtual power supply line V_VDD (hereinafter referred to as a V_VDD line), respectively. The power switch 493 controls application of a voltage VDDH to the level shifter 494. A voltage VSSS is input to the CPU 400 and the PMU 193 without through the power switches. The voltage VDDD is input to the PMU 193 without through the power switches.

The voltages VDDD and VDD1 are drive voltages for a CMOS circuit. The voltage VDD1 is lower than the voltage VDDD and is a drive voltage in a sleep state. The voltage VDDH is a drive voltage for an OS transistor and is higher than the voltage VDDD.

The L1 cache memory device 403, the L2 cache memory device 404, and the bus interface portion 405 each include at least a power domain capable of power gating. The power domain capable of power gating is provided with one or a plurality of power switches. These power switches are controlled by the PG control signal.

The flip-flop 480 is used for a register. The flip-flop 480 is provided with a backup circuit. The flip-flop 480 is described below.

Figure 20A:
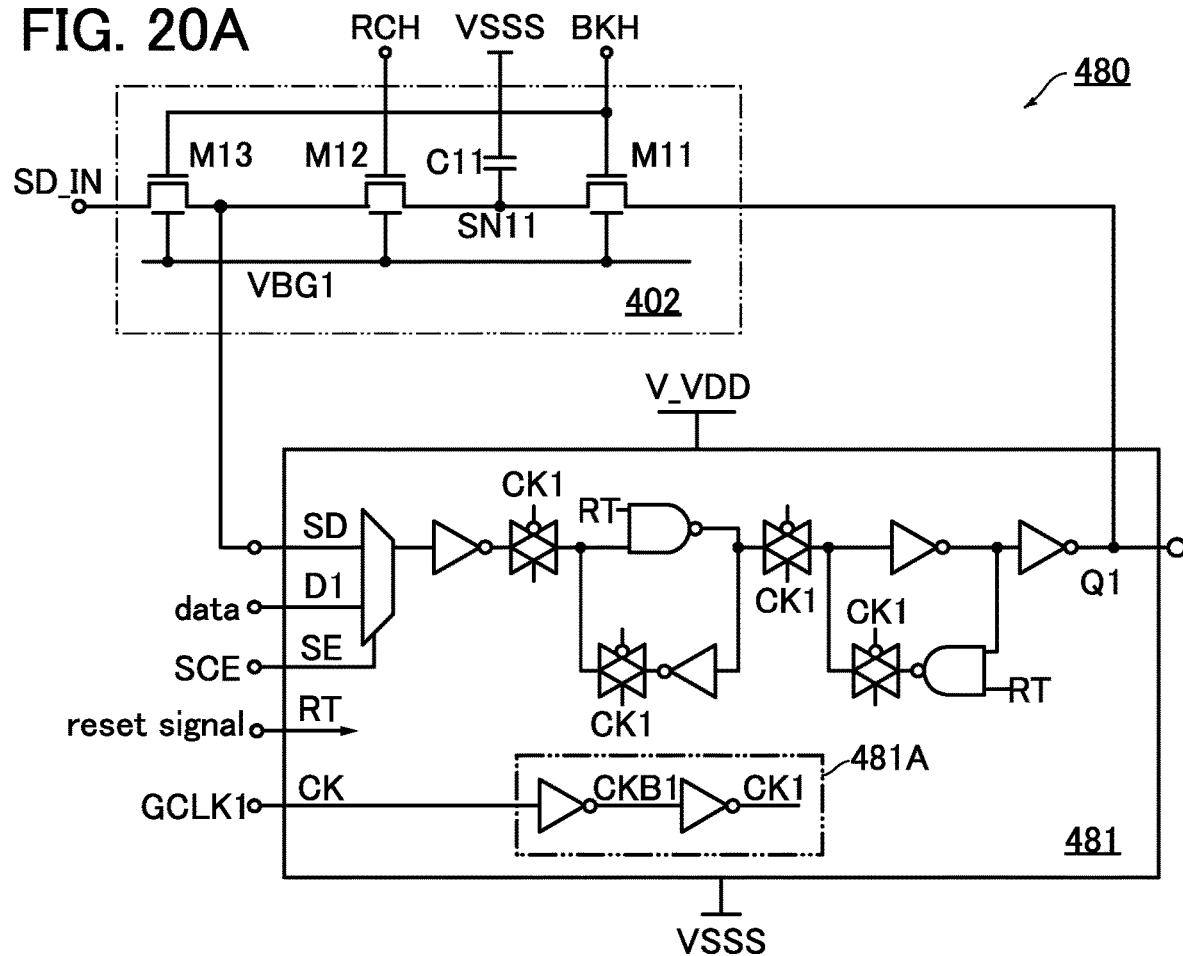
FIG. 20A and FIG. 20B are diagrams illustrating a circuit configuration example of a flip-flop circuit.
Figure 20B:
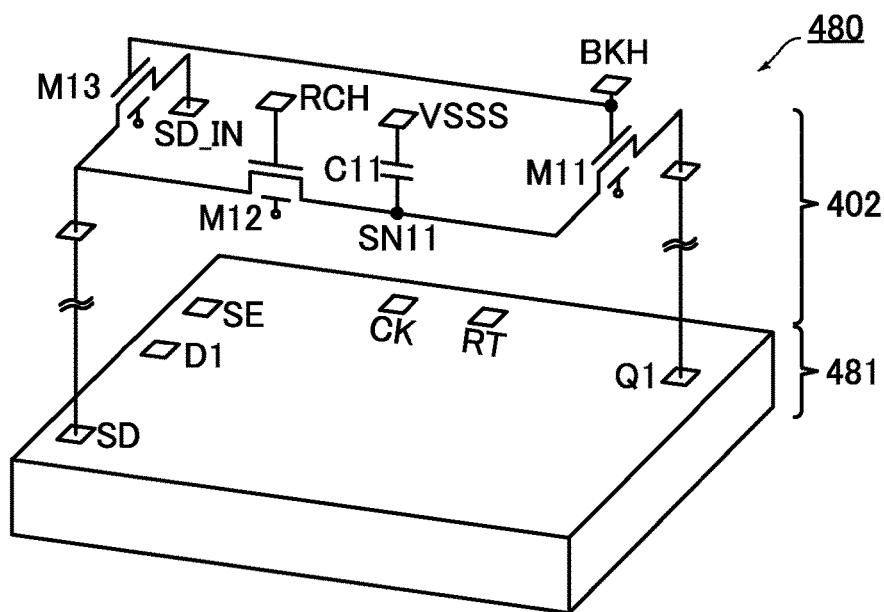

FIG. 20A illustrates a circuit configuration example of the flip-flop 480. The flip-flop 480 includes a scan flip-flop 481 and a backup circuit 402. FIG. 20B is a perspective view illustrating the circuit configuration example of the flip-flop 480.

The scan flip-flop 481 includes nodes D1, Q1, SD, SE, RT, and CK and a clock buffer circuit 481A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 481A. Respective analog switches in the scan flip-flop 481 are connected to nodes CK1 and CKB1 of the clock buffer circuit 481A. The node RT is a reset signal input node.

The signal SCE is a scan enable signal, which is generated in the PMU 193. The PMU 193 generates signals BK and RC. The level shifter 494 level-shifts the signals BK and RC to generate signals BKH and RCH. The signal BK is a backup signal and the signal RC is a recovery signal.

The circuit structure of the scan flip-flop 481 is not limited to that in FIG. 20. A scan flip-flop prepared in a standard circuit library can be applied.

The backup circuit 402 includes nodes SD_IN and SN11, transistors M11 to M13, and a capacitor C11.

The node SD_IN is a scan test data input node and is connected to the node Q1 of the scan flip-flop 481. The node SN11 is a retention node of the backup circuit 402. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistors M11 and M13 is controlled by the signal BKH, and the on/off of the transistor M12 is controlled by the signal RCH.

The transistors M11 to M13 are OS transistors like the transistors 321 to 323 included in the above-described memory cell 320. The transistors M11 to M13 have back gates in the illustrated structure. The back gates of the transistors M11 to M13 are connected to a power supply line for supplying a voltage VBG1.

At least the transistors M11 and M12 are preferably OS transistors. Because of extremely low off-state current, which is a feature of the OS transistor, a decrease in the voltage of the node SN11 can be suppressed and almost no power is consumed to retain data; therefore, the backup circuit 402 has a nonvolatile characteristic. Data is rewritten by charging and discharging of the capacitor C11; hence, there is theoretically no limitation on rewrite cycles of the backup circuit 402, and data can be written and read out with low energy.

All of the transistors in the backup circuit 402 are extremely preferably OS transistors. As illustrated in FIG. 20B, the backup circuit 402 can be stacked on the scan flip-flop 481 configured with a silicon CMOS circuit.

The number of elements in the backup circuit 402 is much smaller than the number of elements in the scan flip-flop 481; thus, there is no need to change the circuit structure and layout of the scan flip-flop 481 in order to stack the backup circuit 402. That is, the backup circuit 402 is a backup circuit that has very broad utility. In addition, the backup circuit 402 can be provided in a region where the scan flip-flop 481 is formed; thus, even when the backup circuit 402 is incorporated, the area overhead of the flip-flop 480 can be zero. Thus, the backup circuit 402 is provided in the flip-flop 480, whereby power gating of the CPU core 401 is enabled. The power gating of the CPU core 401 is enabled with high efficiency owing to little energy necessary for the power gating.

When the backup circuit 402 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 481. That is, even when the backup circuit 402 is provided, the performance of the flip-flop 480 does not substantially decrease.

The CPU core 401 can be set to a clock gating state, a power gating state, or a resting state as a low power consumption state. The PMU 193 selects the low power consumption mode of the CPU core 401 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 491 and turns on the power switch 492 to input the voltage VDD1 to the CPU core 401. The voltage VDD1 is a voltage at which data in the scan flip-flop 481 is not lost. When the frequency scaling is performed, the PMU 193 reduces the frequency of the clock signal GCLK1.

In the case where the CPU core 401 transitions from a normal operation state to a power gating state, data in the scan flip-flop 481 is backed up to the backup circuit 402. When the CPU core 401 is returned from the power gating state to the normal operation state, recovery operation of writing back data in the backup circuit 402 to the scan flip-flop 481 is performed.

Figure 21:
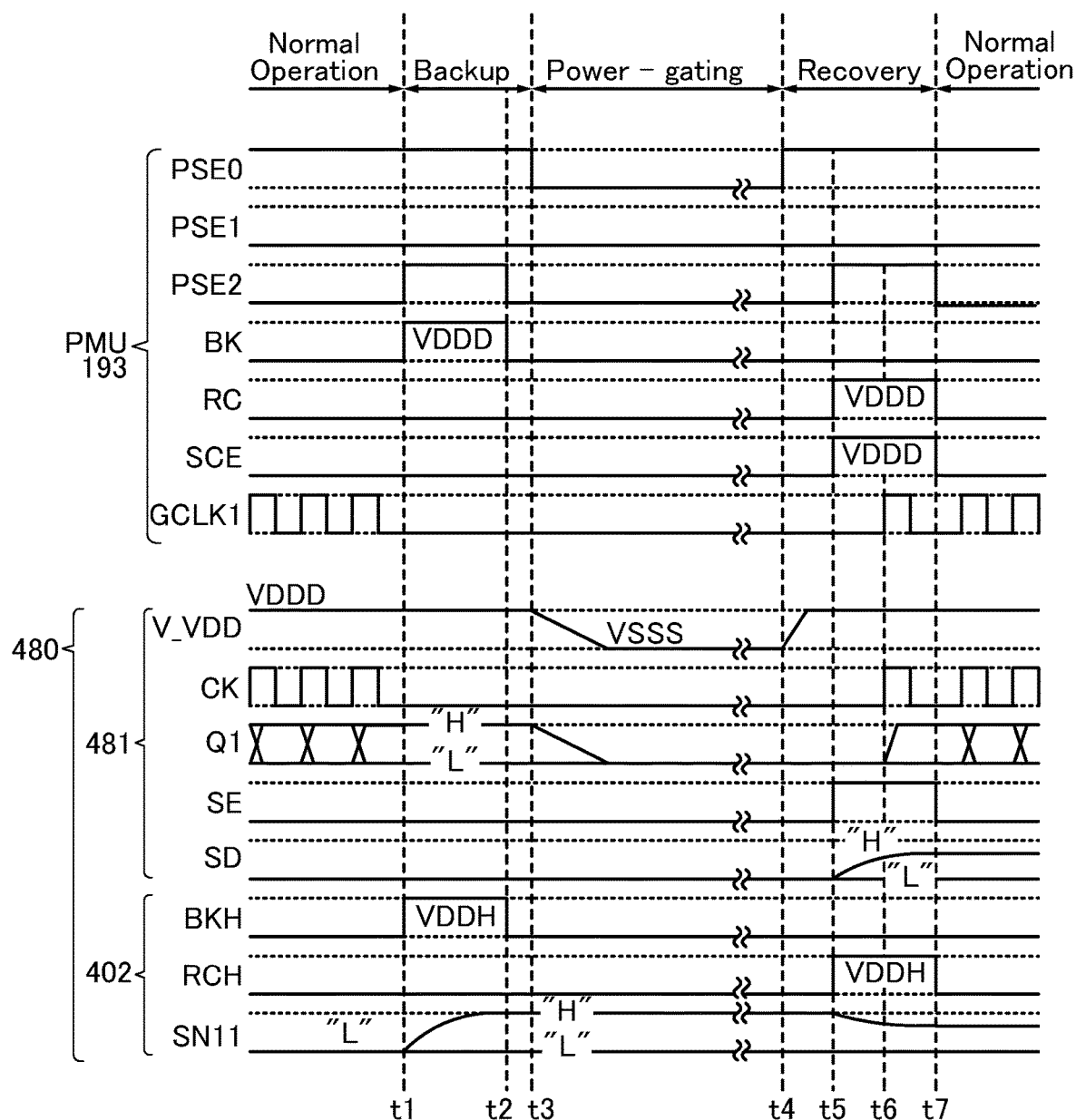
FIG. 21 is a timing chart showing an operation example of a CPU.

FIG. 21 is a timing chart showing an example of a power gating sequence of the CPU core 401. Note that in FIGS. 21, t1 to t7 represent the time. Signals PSE0 to PSE2 are control signals of the power switches 491 to 493, which are generated in the PMU 193. When the signal PSE0 is at "H"/"L", the power switch 491 is on/off. The same applies also to the signals PSE1 and PSE2.

Until Time t1, a normal operation is performed. The power switch 491 is on, and the voltage VDDD is input to the CPU core 401. The scan flip-flop 481 performs the normal operation. At this time, the level shifter 494 does not need to be operated; thus, the power switch 493 is off and the signals SCE, BK, and RC are each at "L". The node SE is at "L"; thus, the scan flip-flop 481 stores data in the node D1. Note that in the example of FIG. 21, the node SN11 of the backup circuit 402 is at "L" at Time t1.

A backup operation is described. At the operation Time t1, the PMU 193 stops the clock signal GCLK1 and sets the signals PSE2 and BK at "H". The level shifter 494 becomes active and outputs the signal BKH at "H" to the backup circuit 402.

The transistor M11 in the backup circuit 402 is turned on, and data in the node Q1 of the scan flip-flop 481 is written to the node SN11 of the backup circuit 402. When the node Q1 of the scan flip-flop 481 is at "L", the node SN11 remains at "L", whereas when the node Q1 is at "H", the node SN11 becomes "H".

The PMU 193 sets the signals PSE2 and BK at "L" at Time t2 and sets the signal PSE0 at "L at Time t3. The state of the CPU core 401 transitions to a power gating state at Time t3. Note that at the timing when the signal BK falls, the signal PSE0 may fall.

A power-gating operation is described. When the signal PSE0 is set at "L, data in the node Q1 is lost because the voltage of the V_VDD line decreases. The node SN11 retains data that is stored in the node Q1 at Time t3.

A recovery operation is described. When the PMU 193 sets the signal PSE0 at "H" at Time t4, the power gating state transitions to a recovery state. Charging of the V_VDD line starts, and the PMU 193 sets the signals PSE2, RC, and SCE at "H" in a state where the voltage of the V_VDD line becomes VDDD (at Time t5).

The transistor M12 is turned on, and electric charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 481. When the clock signal GCLK1 is input to the node CK at Time t6, data in the latch circuit on the input side is written to the node Q1. That is, data in the node SN11 is written to the node Q1.

When the PMU 193 sets the signals PSE2, SCE, and RC at "L" at Time t7, the recovery operation is terminated.

The backup circuit 402 using an OS transistor is extremely suitable for normally-off computing because both dynamic power consumption and static power consumption are low. Note that the CPU 400 including the CPU core 401 including the backup circuit 402 using an OS transistor can be referred to as NoffCPU (registered trademark). The NoffCPU includes a nonvolatile memory, and power supply to the NoffCPU can be stopped during the time when the NoffCPU does not need to operate. Even when the flip-flop 480 is mounted, a decrease in the performance and an increase in the dynamic power of the CPU core 401 can be made hardly to occur.

Note that the CPU core 401 may include a plurality of power domains capable of power gating. In the plurality of power domains, one or a plurality of power switches for controlling voltage input are provided. In addition, the CPU core 401 may include one or a plurality of power domains where power gating is not performed. For example, the power domain where power gating is not performed may be provided with a power gating control circuit for controlling the flip-flop 480 and the power switches 491 to 493.

Note that the application of the flip-flop 480 is not limited to the CPU 400. In the CPU 400, the flip-flop 480 can be used as the register provided in a power domain capable of power gating.

The composition, structure, method, and the like described in this embodiment can be used in combination as appropriate with the compositions, structures, methods, and the like described in the other embodiments and the like.

Embodiment 4

In this embodiment, structure examples of transistors that can be used in the CPU 400 and the semiconductor device 100 described in the above embodiment are described. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Figure 22:
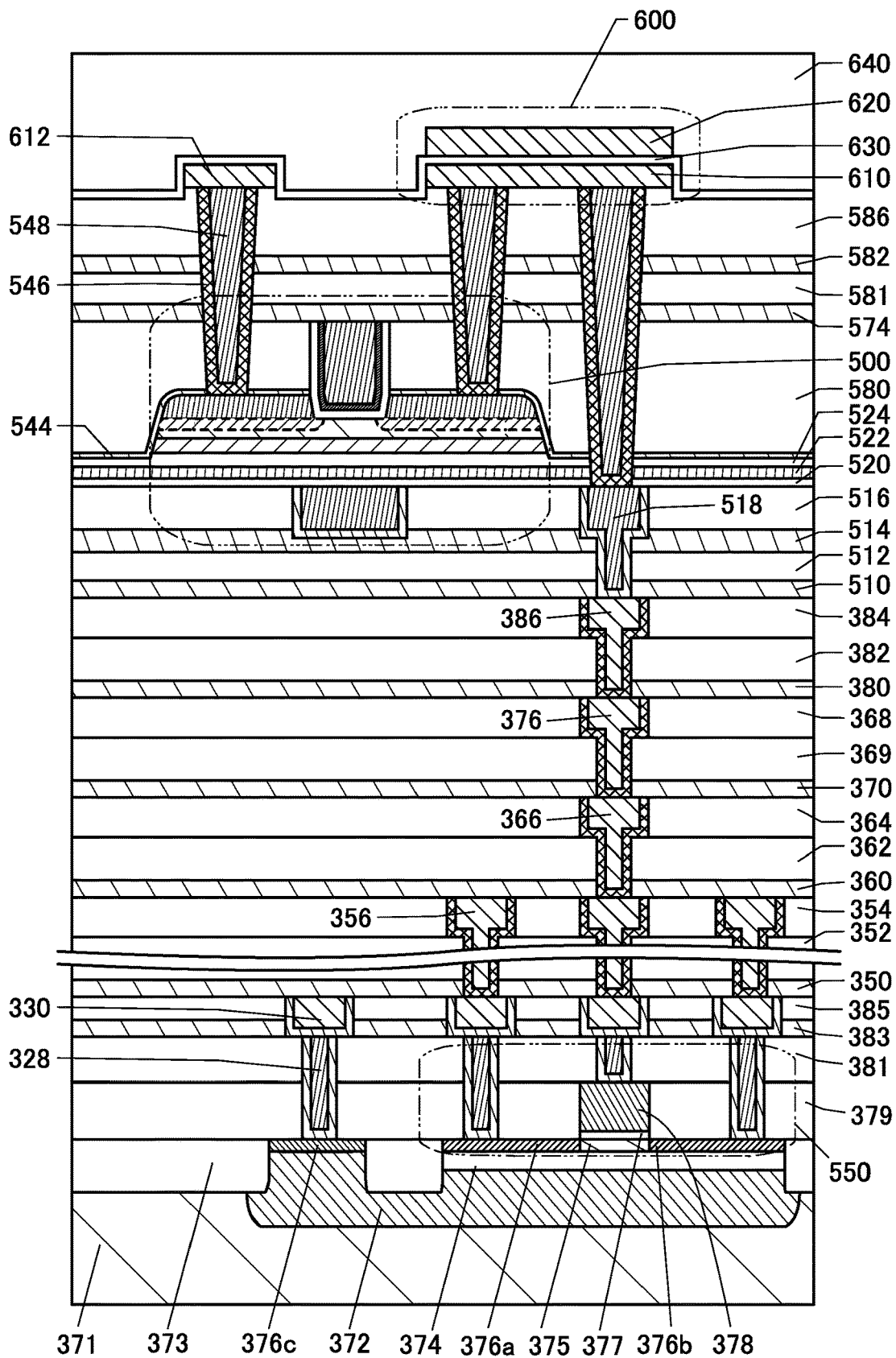
FIG. 22 is a diagram illustrating a structure example of a semiconductor device.
Figure 23A:
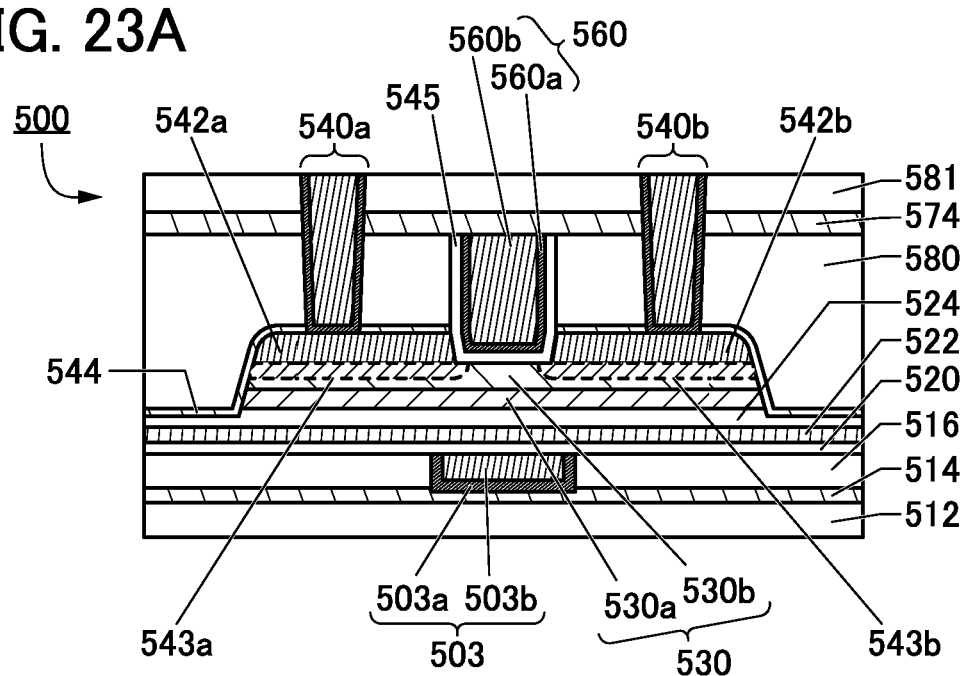
FIG. 23A and FIG. 23B are diagrams illustrating a structure example of a transistor.
Figure 23B:
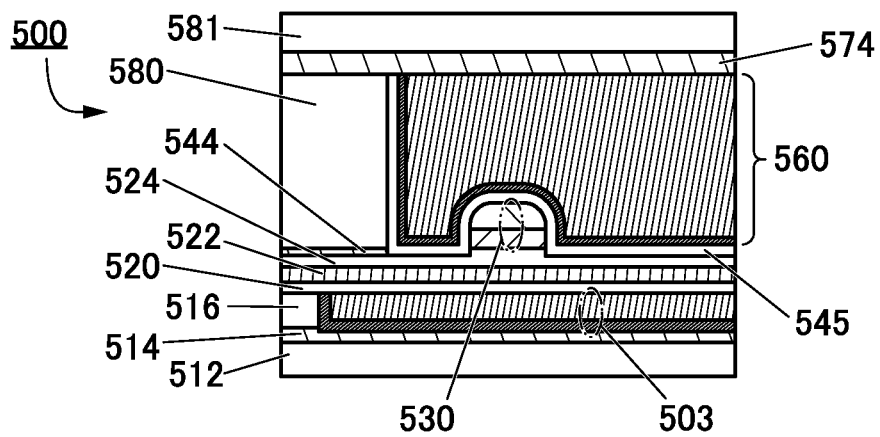

FIG. 22 illustrates part of a cross-sectional structure of a semiconductor device. The semiconductor device illustrated in FIG. 22 includes a transistor 550, a transistor 500, and a capacitor 600. FIG. 23A is a cross-sectional view of the transistor 500 in the channel length direction, and FIG. 23B is a cross-sectional view of the transistor 500 in the channel width direction. For example, the transistor 500 corresponds to an OS transistor included in the memory cell 320 described in the above embodiment, that is, a transistor including an oxide semiconductor in its channel formation region. The transistor 550 corresponds to a Si transistor included in the arithmetic circuit portion 210 described in the above embodiment, that is, a transistor including silicon in its channel formation region.

The transistor 500 is an OS transistor. The off-state current of an OS transistor is extremely low. Accordingly, data voltage or charge written to a storage node through the transistor 500 can be retained for a long time. In other words, power consumption of the semiconductor device can be reduced because the storage node has a low frequency of refresh operation or requires no refresh operation.

In FIG. 22, the transistor 500 is provided above the transistor 550, and the capacitor 600 is provided above the transistor 550 and the transistor 500.

The transistor 550 is provided on a substrate 371. The substrate 371 is a p-type silicon substrate, for example. The substrate 371 may be an n-type silicon substrate. An oxide layer 374 is preferably an insulating layer formed with an oxide buried (Burried oxide) into the substrate 371 (the insulating layer is also referred to as a BOX layer), for example, is a silicon oxide. The transistor 550 is formed using a single crystal silicon provided over the substrate 371 with the oxide layer 374 sandwiched therebetween; that is, the transistor 550 is provided on an SOI (Silicon On Insulator) substrate.

The substrate 371 included in the SOI substrate is provided with an insulator 373 serving as an element isolation layer. The substrate 371 includes a well region 372. The well region 372 is a region to which n-type or p-type conductivity is imparted in accordance with the conductivity of the transistor 550. The single-crystal silicon in the SOI substrate is provided with a semiconductor region 375 and a low-resistance region 376*a* and a low-resistance region 376*b* each of which function as a source region or a drain region. A low-resistant region 376*c* is provided over the well region 372.

The transistor 550 can be provided so as to overlap with the well region 372 to which an impurity element imparting conductivity is added. The well region 372 can function as a bottom-gate electrode of the transistor 550 by independently changing the potential of the low-resistance region 376*c*. Moreover, the threshold voltage of the transistor 550 can be controlled. In particular, when a negative potential is applied to the well region 372, the threshold voltage of the transistor 550 can be further increased, and the off-state current can be reduced. Thus, a negative potential is applied to the well region 372, so that a drain current when a potential applied to a gate electrode of the Si transistor is 0 V can be reduced. As a result, power consumption due to shoot-through current or the like in the arithmetic circuit portion 210 including the transistor 550 can be reduced, and the arithmetic efficiency can be improved.

The transistor 550 preferably has a structure in which the top surface and the side surface in the channel width direction of the semiconductor layer are covered with a conductor 378 with an insulator 377 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 378 sometimes functions as a first gate (also referred to as a top gate) electrode. In addition, the well region 372 sometimes functions as a second gate (also referred to as a bottom gate) electrode. In that case, a potential applied to the well region 372 can be controlled through the low-resistance region 376*c*.

A region of the semiconductor region 375 where a channel is formed, a region in the vicinity thereof, the low-resistance region 376*a* and the low-resistance region 376*b* each functioning as a source region or a drain region, the low-resistance region 376*c* connected to an electrode controlling a potential of the well region 372, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The well region 372, the low-resistance region 376*a*, the low-resistance region 376*b*, and the low-resistance region 376c contain an element which imparts n-type conductivity, such as arsenic or phosphorus, or an element which imparts p-type conductivity, such as boron, in addition to the semiconductor material used for the semiconductor region 375.

For the conductor 378 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used. Alternatively, silicide such as nickel silicide may be used for the conductor 378.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

To form each of the low-resistance region 376a, the low-resistance region 376b, and the low-resistance region 376c, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 378 functioning as a gate electrode and the side surface of the insulator functioning as a gate insulating film. This structure can prevent the conductor 378 and the low-resistance region 376a and the low-resistance region 376b from being brought into a conduction state.

An insulator 379, an insulator 381, an insulator 383, and an insulator 385 are stacked in this order to cover the transistor 550.

For the insulator 379, the insulator 381, the insulator 383, and the insulator 385, silicon oxide, silicon oxynitride, silicon nitride oxide, silicon nitride, aluminum oxide, aluminum oxynitride, aluminum nitride oxide, aluminum nitride, or the like is used, for example.

Note that in this specification, oxynitride refers to a material that contains more oxygen than nitrogen. For example, silicon oxynitride refers to a material that contains oxygen, nitrogen, and silicon in its composition and contains more oxygen than nitrogen. Furthermore, in this specification, nitride oxide refers to a material that contains more oxygen than nitrogen. For example, aluminum nitride oxide refers to a material that contains oxygen, nitrogen, and aluminum in its composition and contains more nitrogen than oxygen.

The insulator 381 may have a function of a planarization film for eliminating a level difference caused by the transistor 550 or the like provided below the insulator 381. For example, a top surface of the insulator 381 may be planarized by planarization treatment using a chemical mechanical polishing (CMP) method or the like to improve planarity.

In addition, for the insulator 383, it is preferable to use a film having a barrier property that prevents diffusion of hydrogen or impurities from the substrate 371, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 383 that is converted into hydrogen atoms per area of the insulator 383 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 385 is preferably lower than that of the insulator 383. For example, the dielectric constant of the insulator 385 is preferably lower than 4, further preferably lower than 3. The dielectric constant of the insulator 385 is, for example, preferably 0.7 times or less, further preferably 0.6 times or less the dielectric constant of the insulator 383. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 379, the insulator 381, the insulator 383, and the insulator 385. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten and/or molybdenum, and it is preferable to use tungsten. Alternatively, it is preferable to use a low-resistance conductive material such as aluminum and/or copper. The use of a low-resistance conductive material can reduce wiring resistance.

A wiring layer may be provided over the insulator 385 and the conductor 330. For example, in FIG. 22, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 383, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 22, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 383, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 22, an insulator 370, an insulator 369, and an insulator 368 are provided to be stacked in this order. Furthermore, the conductor 376 is formed in the insulator 370, the insulator 369, and the insulator 368. The conductor 376 has a function of a plug or a wiring. Note that the conductor 376 can be provided using a material similar to those for the conductor 328 and the conductor 330.

Note that for example, like the insulator 383, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 368 and the conductor 376. For example, in FIG. 22, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 383, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen and hydrogen is preferably used for any of the insulator 510, the insulator 512, the insulator 514, and the insulator 516.

For example, for the insulator 510 and the insulator 514, it is preferable to use a film having a barrier property against hydrogen and impurities diffused from the substrate 371, a region where the transistor 550 is provided, or the like into the region where the transistor 500 is provided. Therefore, a material similar to that for the insulator 383 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 379 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and/or the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 23A and FIG. 23B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 23A and FIG. 23B, an insulator 544 is preferably positioned between the insulator 580 and the oxide 530a, the oxide 530b, the conductor 542a, and the conductor 542b. Furthermore, as illustrated in FIG. 23A and FIG. 23B, the conductor 560 preferably includes a conductor 560a provided inside the insulator 545 and a conductor 560b provided to be embedded inside the conductor 560a. Moreover, as illustrated in FIG. 23A and FIG. 23B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 22, FIG. 23A, and FIG. 23B is an example, and the structures are not limited thereto; an appropriate transistor can be used in accordance with a circuit configuration and/or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 not in synchronization with but independently of a voltage applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560.

Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material having a function of preventing diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 is illustrated to have a stacked layer of the conductor 503a and the conductor 503b in this embodiment, the conductor 503 may have a single-layer structure.

The insulator 520, the insulator 522 and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose VoH is sufficiently reduced. When an oxide semiconductor with sufficiently reduced impurities such as VoH is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator in the vicinity of the oxide 530 in some cases. Some hydrogen may be gettered into the conductor 542a and the conductor 542b in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 and/or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and/or mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 23A and FIG. 23B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 23A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 23A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately determined in consideration of required transistor characteristics.

The insulator 544 can inhibit impurities such as water and hydrogen contained in the insulator 580 from diffusing into the oxide 530b. Furthermore, oxidation of the conductor 542a and/or the conductor 542b due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. The above-described microwave treatment may be performed before and/or after the insulator 545 is formed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 23A and FIG. 23B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material that has a function of inhibiting the diffusion of oxygen (e.g., at least one of an oxygen atom, an oxygen molecule, and the like). When the conductor 560a has a function of inhibiting diffusion of oxygen, a reduction in conductivity of the conductor 560b due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structure of the conductor 540a and the conductor 540b are similar to a structure of a conductor 546 and a conductor 548 that will be described later.

An insulator 582 is provided over the insulator 581. A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 379 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten and/or molybdenum, and it is particularly preferable to use tungsten. In addition, in the case where the conductor 620 is formed concurrently with another component such as a conductor, Cu (copper), Al (aluminum), and/or the like, which is a low-resistance metal material, is used.

An insulator 640 is provided over the conductor 620 and the insulator 630. For the insulator 640, a material similar to that for the insulator 379 can be used. In addition, the insulator 640 may function as a planarization film that covers an uneven shape therebelow.

With the use of this structure, a semiconductor device using a transistor including an oxide semiconductor can be miniaturized or highly integrated.

The composition, structure, method, and the like described in this embodiment can be used in combination as appropriate with the compositions, structures, methods, and the like described in the other embodiments and the like.

Embodiment 5

In this embodiment, the structure of an integrated circuit including components of the arithmetic processing system 1000 described in the above embodiment will be described with reference to FIG. 24A and FIG. 24B.

Figure 24A:
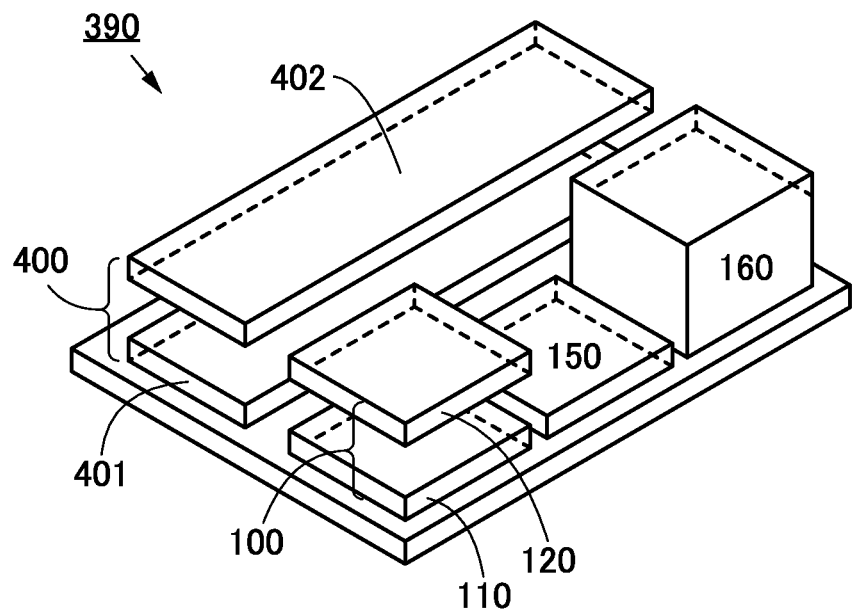
FIG. 24A and FIG. 24B are diagrams each illustrating a structure example of an integrated circuit.

FIG. 24A is an example of a schematic diagram for explaining the integrated circuit including the components of the arithmetic processing system 1000. The integrated circuit 390 illustrated in FIG. 24A can be one integrated circuit in which circuits are integrated in such a manner that some of circuits included in the CPU 400 and the accelerator described as the semiconductor device 100 are formed using OS transistors.

As illustrated in FIG. 24A, in the CPU 400, the backup circuit 402 can be provided in the layer including OS transistors over the CPU core 401. As illustrated in FIG. 24A, in the semiconductor device 100, the layer 120 including OS transistors included in the memory circuit portion 310 can be provided over the layer 110 including Si transistors included in the arithmetic circuit portion 210. Driver circuits such as the write bit line driver circuit 220, the read word line driver circuit 230, and the write word line driver circuit 240 can be provided in the layer 110.

As illustrated in FIG. 24A, the control device 150, the memory device 160, and the like can be provided. As the memory device 160, a NOSRAM or a DOSRAM described in the above embodiment as well as an SRAM, a DRAM, or the like including a Si transistor can be used. Alternatively, an MRAM, a PRAM, an ReRAM, an FeRAM, or the like may be used as the memory device 160.

In the memory device 160, the layer including OS transistors is stacked over the driver circuit provided in the layer including Si transistors, whereby the memory density can be improved.

In the case of the SoC in which the circuits such as the CPU 400, the semiconductor device 100, the control device 150, and the memory device 160 are tightly coupled as illustrated in FIG. 24A, although heat generation is a problem, an OS transistor is preferable because the amount of change in the electrical characteristics due to heat is small as compared with a Si transistor. By integration of the circuits in the three-dimensional direction as illustrated in FIG. 24A, parasitic capacitance can be reduced as compared with a stacked structure using a through silicon via (TSV), for example. Thus, power consumption needed for charging and discharging wirings can be reduced. Consequently, the arithmetic processing efficiency can be improved.

Figure 24B:
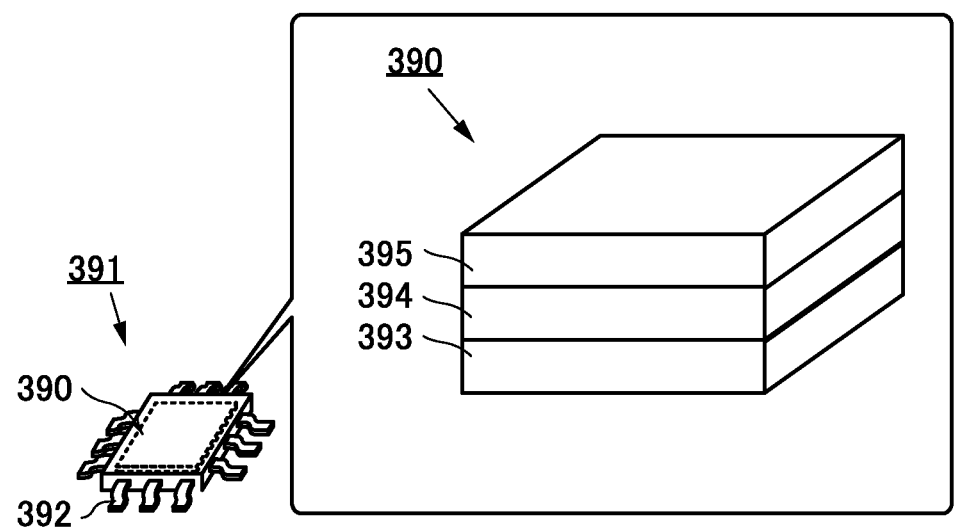

FIG. 24B illustrates an example of a semiconductor chip including the integrated circuit 390. A semiconductor chip 391 illustrated in FIG. 24B includes leads 392 and the integrated circuit 390. As for the integrated circuit 390, the various circuits described in the above embodiment are provided in one die as illustrated in FIG. 24A. The integrated circuit 390 has a stacked-layer structure, which is roughly divided into a layer including Si transistors (a Si transistor layer 393), a wiring layer 394, and a layer including OS transistors (an OS transistor layer 395). Since the OS transistor layer 395 can be stacked over the Si transistor layer 393, a reduction in the size of the semiconductor chip 391 is facilitated.

Although a QFP (Quad Flat Package) is used as the package of the semiconductor chip 391 in FIG. 24B, the form of the package is not limited thereto. For other examples, a DIP (Dual In-line Package) and a PGA (Pin Grid Array), which are of an insertion mount type; an SOP (Small Outline Package), an SSOP (Shrink Small Outline Package), a TSOP (Thin-Small Outline Package), an LCC (Leaded Chip Carrier), a QFN (Quad Flat Non-leaded package), a BGA (Ball Grid Array), and an FBGA (Fine pitch Ball Grid Array), which are of a surface mount type; a DTP (Dual Tape carrier Package) and a QTP (Quad Tape-carrier Package), which are of a contact mount type; and the like can be used as appropriate.

All the arithmetic circuit and the driver circuit including Si transistors and the memory circuit including OS transistors can be formed in the Si transistor layer 393, the wiring layer 394, and the OS transistor layer 395. In other words, elements included in the semiconductor device can be formed through the same manufacturing process. Thus, the number of steps in the manufacturing process of the semiconductor chip 391 illustrated in FIG. 24B does not need to be increased even when the number of elements is increased, and accordingly the semiconductor device can be incorporated into the semiconductor chip 391 at low cost.

The composition, structure, method, and the like described in this embodiment can be used in combination as appropriate with the compositions, structures, methods, and the like described in the other embodiments and the like.

Embodiment 6

In this embodiment, an electronic device, a moving object, and an arithmetic system to which the integrated circuit 390 described in the above embodiment can be used will be described with reference to FIG. 25A to FIG. 28.

Figure 25B:
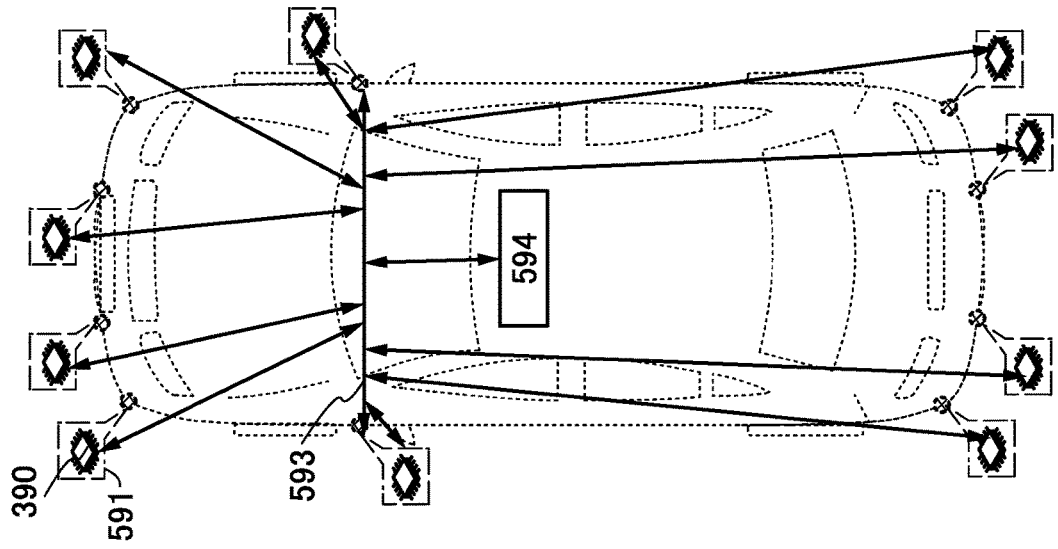
FIG. 25A and FIG. 25B are diagrams illustrating an application example of an integrated circuit.
Figure 25A:
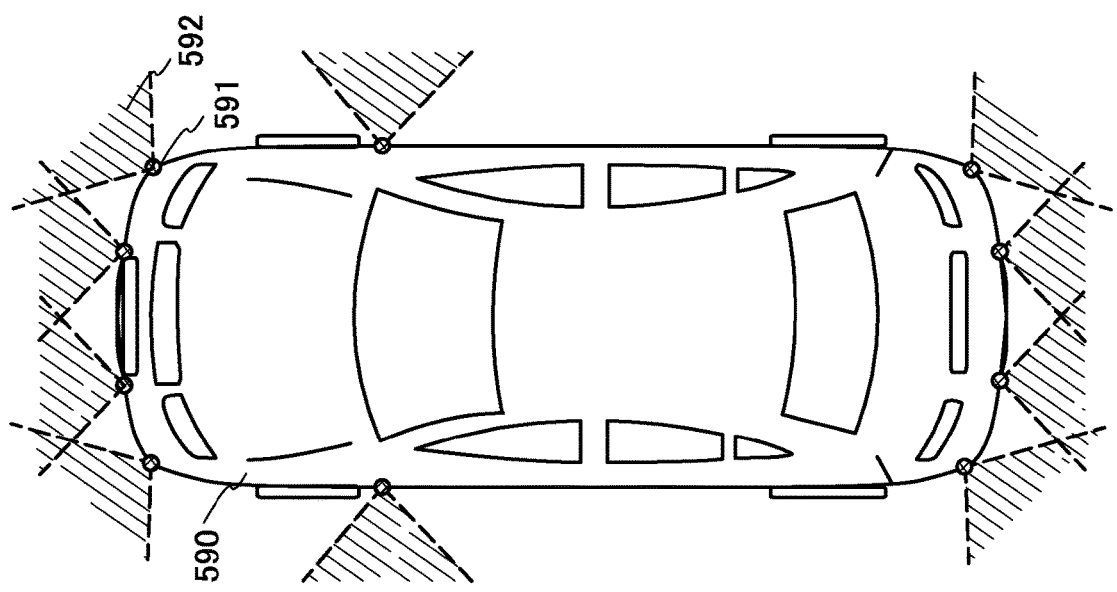

FIG. 25A illustrates an external view of an automobile as an example of a moving object.

FIG. 25B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 (or the semiconductor chip 391 including the integrated circuit 390) can be used for the camera 591 and the like. The automobile 590 can perform autonomous driving by judging surrounding traffic information such as the presence of a guardrail and/or a pedestrian in such a manner that the camera 591 processes a plurality of images taken in a plurality of imaging directions 592 with the integrated circuit 390 described in the above embodiment and the plurality of images are analyzed together with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving vehicle, the moving vehicle is not limited to an automobile. Examples of moving vehicles also include a train, a monorail train, a ship, and a flying object (a helicopter, an unmanned aircraft (a drone), an airplane, and a rocket), and these moving vehicles can include a system utilizing artificial intelligence when equipped with the computer of one embodiment of the present invention.

Figure 26A:
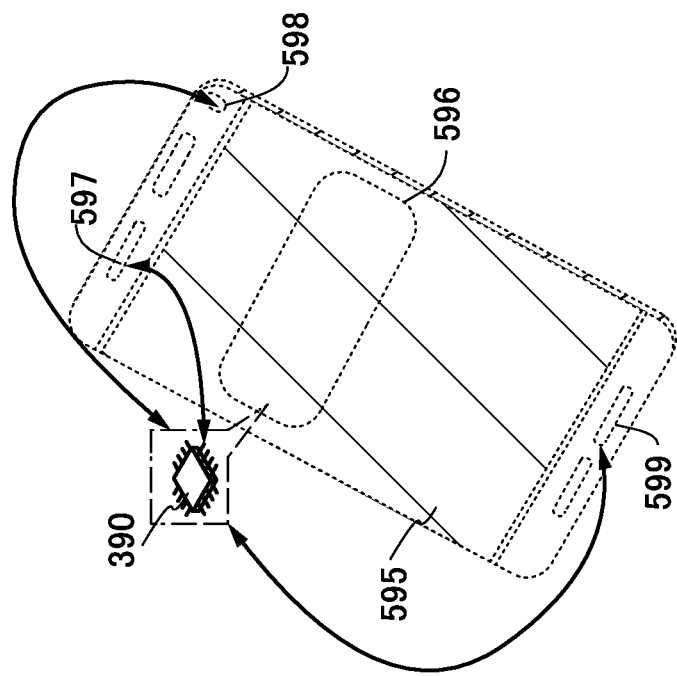
FIG. 26A and FIG. 26B are diagrams illustrating an application example of an integrated circuit.
Figure 26B:
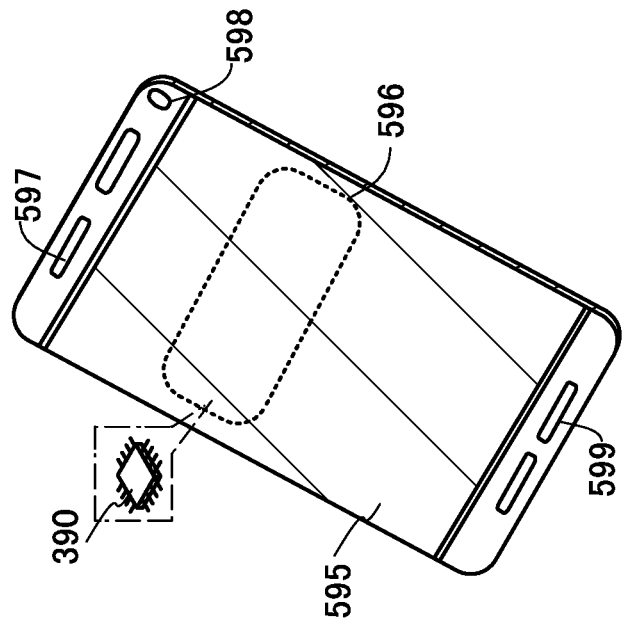

FIG. 26A is an external diagram illustrating an example of a portable electronic device. FIG. 26B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 27A:
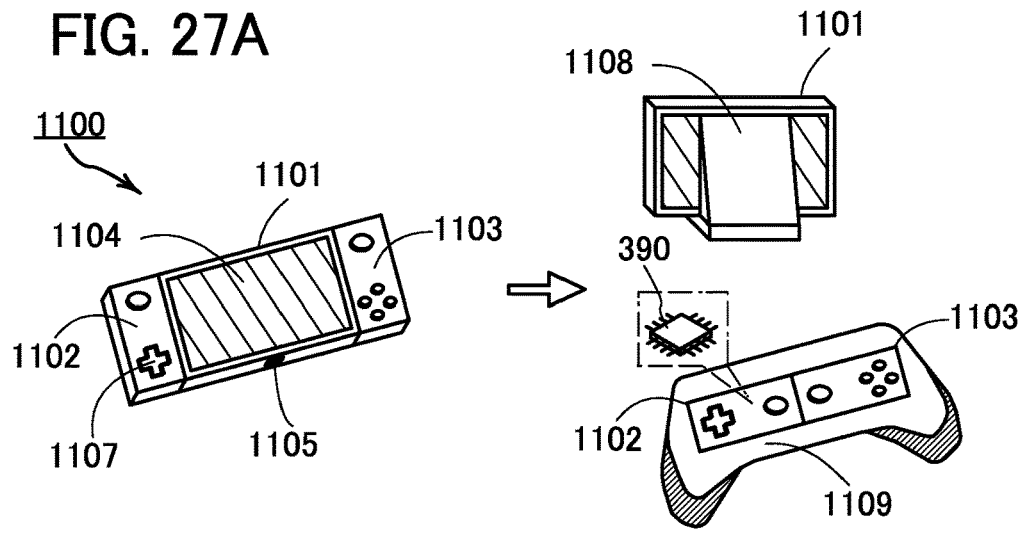
FIG. 27A to FIG. 27C are diagrams each illustrating an application example of an integrated circuit.

A portable game machine 1100 illustrated in FIG. 27A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, an image to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 27B:
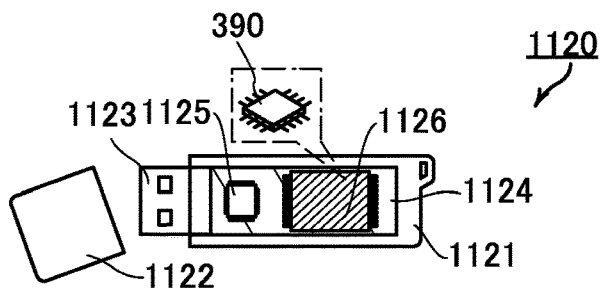

FIG. 27B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 27C:
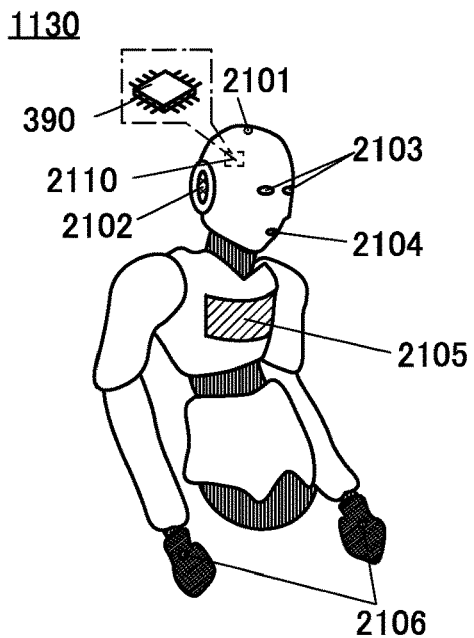

FIG. 27C is a humanoid robot 1130. The robot 1130 includes sensors 2101 to 2106 and a control circuit 2110. For example, the integrated circuit 390 described in the above embodiment can be incorporated into the control circuit 2110.

Figure 28:
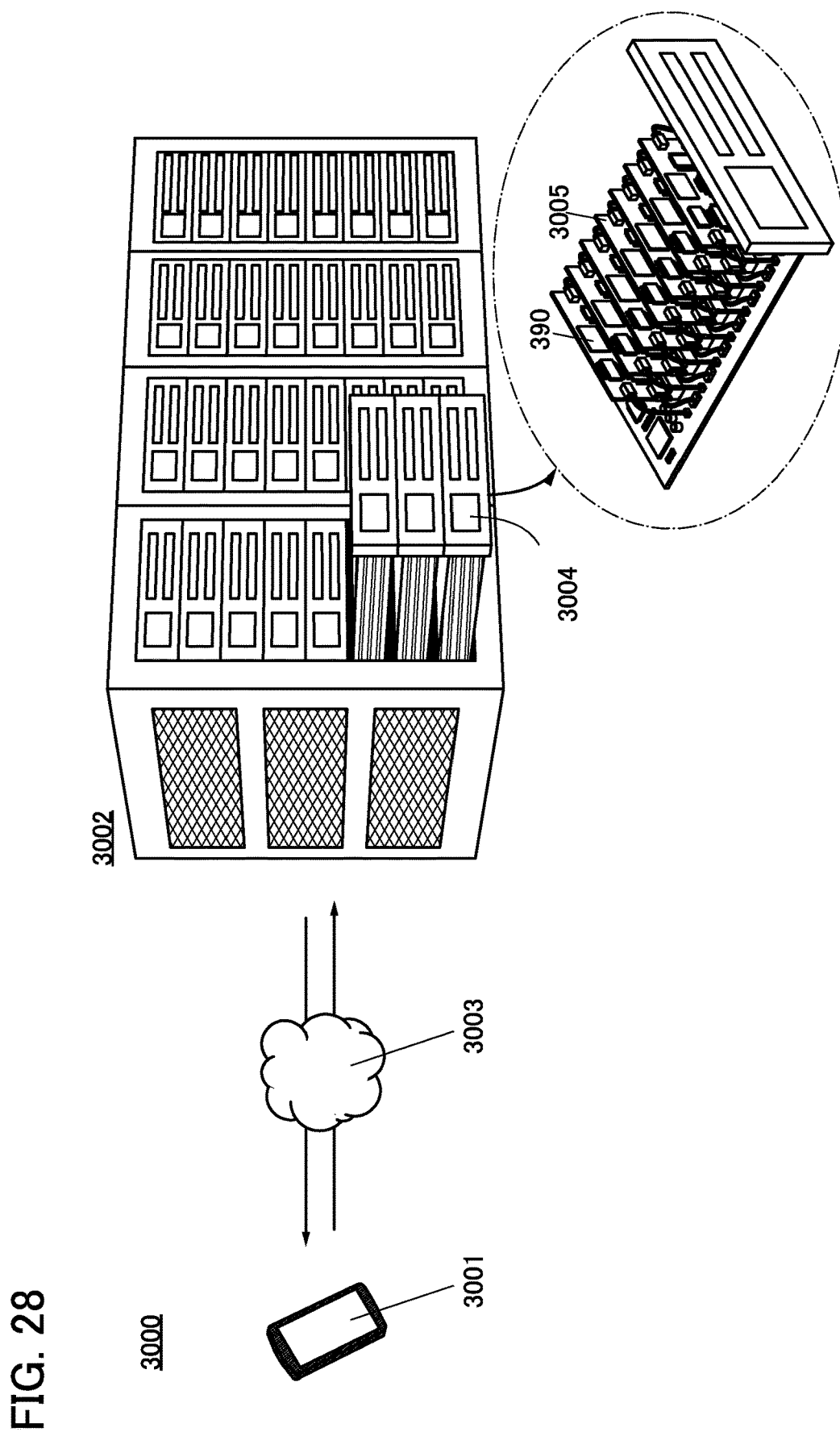
FIG. 28 is a diagram illustrating an application example of an integrated circuit.

The integrated circuit 390 described in the above embodiment can be used for a server that communicates with the electronic devices instead of being incorporated into the electronic devices. In that case, the arithmetic system is configured with the electronic devices and a server. FIG. 28 illustrates a configuration example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of substrates 3005, and the integrated circuit 390 described in the above embodiment can be mounted on each of the substrates 3005. Thus, a neural network is configured in the server 3002. The server 3002 can perform an arithmetic operation of the neural network using data input from the electronic device 3001 through the Internet connection 3003. The result of the arithmetic operation executed by the server 3002 can be transmitted as needed to the electronic device 3001 through the Internet connection 3003. Accordingly, a burden of the arithmetic operation in the electronic device 3001 can be reduced.

The composition, structure, method, and the like described in this embodiment can be used in combination as appropriate with the compositions, structures, methods, and the like described in the other embodiments and the like.

REFERENCE NUMERALS

100: semiconductor device, 110: layer, 120: layer, 150: control device, 160: memory device, 193: PMU, 200: arithmetic block, 210: arithmetic circuit portion, 211: arithmetic circuit, 220: bit line driver circuit, 230: word line driver circuit, 240: word line driver circuit, 290: arithmetic block array, 310: memory circuit portion, 320: memory cell, 321: transistor, 322: transistor, 323: transistor, 324: capacitor

The invention claimed is:

1. A semiconductor device comprising a plurality of arithmetic blocks,
wherein one of the plurality of arithmetic blocks comprises:
an arithmetic circuit portion, a first driver circuit, a second driver circuit and a third driver circuit in a first layer; and
a memory circuit portion in a second layer,
wherein each of the first driver circuit, the second driver circuit and the third driver circuit is electrically connected to the memory circuit portion, and
wherein the memory circuit portion and each of the first driver circuit, the second driver circuit and the third driver circuit overlap each other.

2. The semiconductor device according to claim 1, wherein the first driver circuit is configured to supply data to the memory circuit portion.

3. The semiconductor device according to claim 1, wherein the second driver circuit is configured to control operation of writing data to the memory circuit portion.

4. The semiconductor device according to claim 1, wherein the third driver circuit is configured to control operation of reading out data from the memory circuit portion.

5. The semiconductor device according to claim 1, wherein the arithmetic circuit portion comprises a circuit configured to perform product-sum operation.

6. The semiconductor device according to claim 1, wherein the memory circuit portion is configured to retain data.

7. The semiconductor device according to claim 6, wherein the data is weight data.

8. The semiconductor device according to claim 1, wherein the arithmetic circuit portion comprises a transistor comprising silicon in a semiconductor where a channel is formed.

9. The semiconductor device according to claim 1, wherein the memory circuit portion comprises a transistor comprising an oxide semiconductor in a semiconductor where a channel is formed.

10. The semiconductor device according to claim 9, wherein the oxide semiconductor comprises at least one of indium and zinc.

11. A semiconductor device comprising a plurality of arithmetic blocks arranged in a matrix of M rows and N columns, and N first driver circuits,
wherein each of M and N is independently a natural number greater than or equal to 2,
wherein each of the N first driver circuits is placed in a corresponding column,
wherein each of the plurality of arithmetic blocks comprises an arithmetic circuit portion and a memory circuit portion,
wherein the arithmetic circuit portion is electrically connected to the memory circuit portion in each arithmetic block,
wherein the arithmetic circuit portion and the memory circuit portion in each arithmetic block overlap each other,
wherein e is a natural number greater than or equal to 1 and less than or equal to N, and
wherein each of the memory circuit portions in an e-th column among the plurality of arithmetic blocks is electrically connected to a corresponding first driver circuit in the e-th column among N first driver circuits.

12. The semiconductor device according to claim 11, wherein the arithmetic circuit portion comprises a circuit configured to perform product-sum operation.

13. The semiconductor device according to claim 11, wherein the memory circuit portion is configured to retain data.

14. The semiconductor device according to claim 13, wherein the data is weight data.

15. The semiconductor device according to claim 11, wherein the memory circuit portion comprises a plurality of memory cells, and
wherein each of the memory cells comprises a transistor comprising an oxide semiconductor in a semiconductor where a channel is formed.

16. The semiconductor device according to claim 11, wherein each of the N first driver circuits is configured to supply data to the memory circuit portion.

17. The semiconductor device according to claim 11, further comprising a second driver circuit extending in a column direction,
wherein the second driver circuit is electrically connected to the memory circuit portion.

18. The semiconductor device according to claim 17, wherein the second driver circuit is configured to control operation of writing data to the memory circuit portion.

19. The semiconductor device according to claim 17, further comprising a third driver circuit extending in the column direction,
wherein the third driver circuit is electrically connected to the memory circuit portion.

20. The semiconductor device according to claim 11, wherein each of the plurality of arithmetic blocks comprises a third driver circuit, and
wherein the third driver circuit is electrically connected to the memory circuit portion in each arithmetic block.

21. The semiconductor device according to claim 20, wherein the third driver circuit is configured to control operation of reading out data from the memory circuit portion.

* * * * *